US008440581B2

(12) United States Patent
Im et al.

(10) Patent No.: US 8,440,581 B2
(45) Date of Patent: May 14, 2013

(54) SYSTEMS AND METHODS FOR NON-PERIODIC PULSE SEQUENTIAL LATERAL SOLIDIFICATION

(75) Inventors: James S. Im, New York, NY (US); Ui-Jin Chung, Rego Park, NY (US); Alexander B. Limanov, Millburn, NJ (US); Paul C. Van Der Wilt, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 273 days.

(21) Appl. No.: 12/776,756

(22) Filed: May 10, 2010

(65) Prior Publication Data

US 2011/0121306 A1    May 26, 2011

Related U.S. Application Data

(63) Continuation of application No. PCT/US2010/033565, filed on May 4, 2010.

(60) Provisional application No. 61/264,082, filed on Nov. 24, 2009, provisional application No. 61/286,643, filed on Dec. 15, 2009, provisional application No. 61/291,488, filed on Dec. 31, 2009, provisional application No. 61/291,663, filed on Dec. 31, 2009, provisional application No. 61/294,288, filed on Jan. 12, 2010.

(51) Int. Cl.
*H01L 21/00* (2006.01)

(52) U.S. Cl.
USPC ........... 438/795; 438/150; 438/799; 438/219; 257/66; 257/75; 257/E29.003

(58) Field of Classification Search .................. 438/150, 438/795, 149, 799; 219/121.6, 121.76; 257/66, 257/75, E29.003, E21.347
See application file for complete search history.

(56) References Cited

U.S. PATENT DOCUMENTS

| 3,632,205 A | 1/1972 | Marcy et al. |
| 4,234,358 A | 11/1980 | Celler et al. |

(Continued)

FOREIGN PATENT DOCUMENTS

| CN | 1495848 A | 5/2004 |
| CN | 101111925 A | 1/2008 |

(Continued)

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

(Continued)

*Primary Examiner* — Evan Pert
*Assistant Examiner* — Mark A Laurenzi
(74) *Attorney, Agent, or Firm* — Wilmer Cutler Pickering Hale and Dorr LLP

(57) ABSTRACT

The disclosed systems and method for non-periodic pulse sequential lateral solidification relate to processing a thin film. The method for processing a thin film, while advancing a thin film in a selected direction, includes irradiating a first region of the thin film with a first laser pulse and a second laser pulse and irradiating a second region of the thin film with a third laser pulse and a fourth laser pulse, wherein the time interval between the first laser pulse and the second laser pulse is less than half the time interval between the first laser pulse and the third laser pulse. In some embodiments, each pulse provides a shaped beam and has a fluence that is sufficient to melt the thin film throughout its thickness to form molten zones that laterally crystallize upon cooling. In some embodiments, the first and second regions are adjacent to each other. In some embodiments, the first and second regions are spaced a distance apart.

39 Claims, 20 Drawing Sheets

U.S. PATENT DOCUMENTS

| | | | |
|---|---|---|---|
| 4,309,225 A | 1/1982 | Fan et al. | |
| 4,382,658 A | 5/1983 | Shields et al. | |
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A | 12/1988 | Liu | |
| 4,800,179 A | 1/1989 | Mukai et al. | |
| 4,855,014 A | 8/1989 | Kakimoto et al. | |
| 4,870,031 A | 9/1989 | Sugahara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| 5,076,667 A | 12/1991 | Stewart | |
| RE33,836 E | 3/1992 | Resor, III et al. | |
| 5,145,808 A | 9/1992 | Sameshima et al. | |
| 5,173,441 A | 12/1992 | Yu et al. | |
| 5,204,659 A | 4/1993 | Sarma | |
| 5,233,207 A | 8/1993 | Anzai et al. | |
| 5,247,375 A | 9/1993 | Mochizuki | |
| 5,281,840 A | 1/1994 | Sarma | |
| 5,285,236 A | 2/1994 | Jain | |
| 5,291,240 A | 3/1994 | Jain | |
| 5,294,811 A | 3/1994 | Aoyama | |
| 5,304,357 A | 4/1994 | Sato et al. | |
| 5,338,959 A | 8/1994 | Kim et al. | |
| 5,373,803 A | 12/1994 | Noguchi et al. | |
| 5,395,481 A | 3/1995 | McCarthy | |
| 5,409,867 A | 4/1995 | Asano et al. | |
| 5,453,594 A | 9/1995 | Konecny | |
| 5,456,763 A | 10/1995 | Kaschmitter et al. | |
| 5,496,768 A | 3/1996 | Kudo | |
| 5,512,494 A | 4/1996 | Tanabe et al. | |
| 5,523,193 A | 6/1996 | Nelson | |
| 5,529,951 A | 6/1996 | Noguchi et al. | |
| 5,591,668 A | 1/1997 | Maegawa et al. | |
| 5,663,579 A | 9/1997 | Noguchi | |
| 5,683,935 A | 11/1997 | Miyamoto | |
| 5,710,050 A | 1/1998 | Makita et al. | |
| 5,721,606 A | 2/1998 | Jain | |
| 5,742,426 A | 4/1998 | York | |
| 5,756,364 A | 5/1998 | Tanaka et al. | |
| 5,766,989 A | 6/1998 | Maegawa et al. | |
| 5,767,003 A | 6/1998 | Noguchi | |
| 5,817,548 A | 10/1998 | Noguchi et al. | |
| 5,844,588 A | 12/1998 | Anderson | |
| 5,858,807 A | 1/1999 | Kawamura | |
| 5,861,991 A | 1/1999 | Fork | |
| 5,893,990 A | 4/1999 | Tanaka et al. | |
| 5,960,323 A | 9/1999 | Wakita et al. | |
| 5,986,807 A | 11/1999 | Fork | |
| 6,002,523 A | 12/1999 | Tanaka | |
| 6,014,944 A | 1/2000 | Aklufi et al. | |
| 6,020,244 A | 2/2000 | Thompson et al. | |
| 6,045,980 A | 4/2000 | Edelkind et al. | |
| 6,072,631 A | 6/2000 | Guenther et al. | |
| 6,081,381 A | 6/2000 | Shalapenok et al. | |
| 6,117,752 A | 9/2000 | Suzuki et al. | |
| 6,120,976 A | 9/2000 | Treadwell et al. | |
| 6,130,009 A | 10/2000 | Smith et al. | |
| 6,130,455 A | 10/2000 | Yoshinouchi et al. | |
| 6,136,632 A | 10/2000 | Higashi | |
| 6,156,997 A | 12/2000 | Yamazaki et al. | |
| 6,162,711 A | 12/2000 | Ma et al. | |
| 6,169,014 B1 | 1/2001 | McCulloch et al. | |
| 6,172,820 B1 | 1/2001 | Kuwahara et al. | |
| 6,176,922 B1 | 1/2001 | Aklufi et al. | |
| 6,177,301 B1 | 1/2001 | Jung et al. | |
| 6,187,088 B1 | 2/2001 | Okumura et al. | |
| 6,190,985 B1 | 2/2001 | Buynoski | |
| 6,193,796 B1 | 2/2001 | Yang et al. | |
| 6,203,952 B1 | 3/2001 | O'Brien et al. | |
| 6,235,614 B1 | 5/2001 | Yang et al. | |
| 6,242,291 B1 | 6/2001 | Kusumoto et al. | |
| 6,274,488 B1 | 8/2001 | Talwar et al. | |
| 6,285,001 B1 | 9/2001 | Fleming et al. | |
| 6,300,175 B1 | 10/2001 | Moon et al. | |
| 6,313,435 B1 | 11/2001 | Shoemaker et al. | |
| 6,316,338 B1 | 11/2001 | Jung et al. | |
| 6,320,227 B1 | 11/2001 | Lee et al. | |
| 6,322,625 B2 | 11/2001 | Im | |
| 6,326,186 B1 | 12/2001 | Kirk et al. | |
| 6,326,215 B1 | 12/2001 | Keen | |
| 6,326,286 B1 | 12/2001 | Park et al. | |
| 6,333,232 B1 | 12/2001 | Kunikiyo et al. | |
| 6,341,042 B1 | 1/2002 | Matsunaka et al. | |
| 6,348,990 B1 | 2/2002 | Igasaki et al. | |
| 6,353,218 B1 | 3/2002 | Yamazaki et al. | |
| 6,358,784 B1 | 3/2002 | Zhang et al. | |
| 6,368,945 B1 | 4/2002 | Im | |
| 6,388,146 B1 | 5/2002 | Onishi et al. | |
| 6,388,386 B1 | 5/2002 | Kunii et al. | |
| 6,392,810 B1 | 5/2002 | Tanaka et al. | |
| 6,393,042 B1 | 5/2002 | Tanaka et al. | |
| 6,407,012 B1 | 6/2002 | Miyasaka et al. | |
| 6,410,373 B1 | 6/2002 | Chang et al. | |
| 6,429,100 B2 | 8/2002 | Yoneda et al. | |
| 6,432,758 B1 | 8/2002 | Cheng et al. | |
| 6,437,284 B1 | 8/2002 | Okamoto et al. | |
| 6,444,506 B1 | 9/2002 | Kusumoto et al. | |
| 6,445,359 B1 | 9/2002 | Ho | |
| 6,448,612 B1 | 9/2002 | Miyazaki et al. | |
| 6,451,631 B1 | 9/2002 | Grigoropoulos et al. | |
| 6,455,359 B1 | 9/2002 | Yamazaki et al. | |
| 6,468,845 B1 | 10/2002 | Nakajima et al. | |
| 6,471,772 B1 | 10/2002 | Tanaka | |
| 6,472,684 B1 | 10/2002 | Yamazaki et al. | |
| 6,476,447 B1 | 11/2002 | Yamazaki et al. | |
| 6,479,837 B1 | 11/2002 | Ogawa et al. | |
| 6,482,722 B2 | 11/2002 | Kunii et al. | |
| 6,493,042 B1 | 12/2002 | Bozdagi et al. | |
| 6,495,067 B1 | 12/2002 | Ono et al. | |
| 6,495,405 B2 | 12/2002 | Voutsas et al. | |
| 6,501,095 B2 | 12/2002 | Yamaguchi et al. | |
| 6,506,636 B2 | 1/2003 | Yamazaki et al. | |
| 6,511,718 B1 | 1/2003 | Paz de Araujo et al. | |
| 6,512,634 B2 | 1/2003 | Tanaka et al. | |
| 6,516,009 B1 | 2/2003 | Tanaka et al. | |
| 6,521,492 B2 | 2/2003 | Miyasaka et al. | |
| 6,526,585 B1 | 3/2003 | Hill | |
| 6,528,359 B2 | 3/2003 | Kusumoto et al. | |
| 6,531,681 B1 | 3/2003 | Markle et al. | |
| 6,535,535 B1 | 3/2003 | Yamazaki et al. | |
| 6,555,422 B1 | 4/2003 | Yamazaki et al. | |
| 6,555,449 B1 | 4/2003 | Im et al. | |
| 6,563,077 B2 | 5/2003 | Im | |
| 6,573,163 B2 | 6/2003 | Voutsas et al. | |
| 6,573,531 B1 | 6/2003 | Im et al. | |
| 6,577,380 B1 | 6/2003 | Sposili et al. | |
| 6,582,827 B1 | 6/2003 | Im | |
| 6,590,228 B2 | 7/2003 | Voutsas et al. | |
| 6,608,326 B1 | 8/2003 | Shinagawa et al. | |
| 6,621,044 B2 | 9/2003 | Jain et al. | |
| 6,635,554 B1 | 10/2003 | Im et al. | |
| 6,635,932 B2 | 10/2003 | Grigoropoulos et al. | |
| 6,667,198 B2 | 12/2003 | Shimoto et al. | |
| 6,693,258 B2 | 2/2004 | Sugano et al. | |
| 6,734,635 B2 | 5/2004 | Kunii et al. | |
| 6,741,621 B2 | 5/2004 | Asano | |
| 6,750,424 B2 | 6/2004 | Tanaka | |
| 6,755,909 B2 | 6/2004 | Jung | |
| 6,784,455 B2 | 8/2004 | Maekawa et al. | |
| 6,830,993 B1 | 12/2004 | Im et al. | |
| 6,858,477 B2 | 2/2005 | Deane et al. | |
| 6,908,835 B2 | 6/2005 | Sposili et al. | |
| 6,916,690 B2 | 7/2005 | Chang | |
| 6,961,117 B2 | 11/2005 | Im | |
| 6,962,860 B2 | 11/2005 | Yamazaki et al. | |
| 6,984,573 B2 | 1/2006 | Yamazaki et al. | |
| 7,029,996 B2 | 4/2006 | Im et al. | |
| 7,078,281 B2 | 7/2006 | Tanaka et al. | |
| 7,091,411 B2 | 8/2006 | Falk et al. | |
| 7,115,503 B2 | 10/2006 | Im | |
| 7,119,365 B2 | 10/2006 | Takafuji et al. | |

| | | |
|---|---|---|
| 7,132,204 B2 | 11/2006 | Jung |
| 7,144,793 B2 | 12/2006 | Gosain et al. |
| 7,164,152 B2 | 1/2007 | Im |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,297,982 B2 | 11/2007 | Suzuki et al. |
| 7,311,778 B2 | 12/2007 | Im et al. |
| 7,318,866 B2 | 1/2008 | Im |
| 7,326,876 B2 | 2/2008 | Jung |
| 7,364,952 B2 | 4/2008 | Im |
| 7,399,359 B2 | 7/2008 | Im et al. |
| 7,645,337 B2 | 1/2010 | Im et al. |
| 7,700,462 B2 | 4/2010 | Tanaka et al. |
| 7,804,647 B2 | 9/2010 | Mitani et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder et al. |
| 2003/0096489 A1 | 5/2003 | Im et al. |
| 2003/0104682 A1 | 6/2003 | Hara |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0255640 A1 | 11/2005 | Im et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2008/0035863 A1 | 2/2008 | Im et al. |
| 2008/0124526 A1 | 5/2008 | Im |
| 2008/0176414 A1 | 7/2008 | Im |
| 2009/0137105 A1 | 5/2009 | Im |
| 2009/0242805 A1 | 10/2009 | Im |
| 2009/0309104 A1 | 12/2009 | Im et al. |
| 2010/0024865 A1 | 2/2010 | Shah et al. |

FOREIGN PATENT DOCUMENTS

| | | |
|---|---|---|
| DE | 19839718 | 3/2000 |
| DE | 10103670 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04279064 | 10/1992 |
| JP | 5041519 A | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H09-007968 | 1/1997 |
| JP | 9171971 A | 6/1997 |
| JP | H09-270393 | 9/1997 |
| JP | 9260681 A | 10/1997 |
| JP | 9321210 A | 12/1997 |
| JP | 10189998 | 7/1998 |
| JP | H10-244390 | 9/1998 |
| JP | 11025064 A | 1/1999 |
| JP | 11064883 A | 3/1999 |
| JP | 11281997 | 10/1999 |
| JP | H11-297852 | 10/1999 |
| JP | 11330000 A | 11/1999 |
| JP | 2000505241 A | 4/2000 |
| JP | 2000-315652 | 11/2000 |
| JP | 2000346618 | 12/2000 |
| JP | 2001023920 A | 1/2001 |
| JP | 2000223425 | 8/2002 |
| JP | 2002-353142 | 12/2002 |
| JP | 2002353159 A | 12/2002 |
| JP | 2003-031496 | 1/2003 |
| JP | 2004031809 | 1/2003 |
| JP | 20003100653 | 4/2003 |
| JP | 2004-311935 | 11/2004 |
| TW | 457553 B | 10/2001 |
| TW | 464960 A1 | 11/2001 |
| TW | 564465 A | 12/2003 |
| TW | 569350 B | 1/2004 |
| WO | WO-9745827 | 12/1997 |
| WO | WO-9824118 | 6/1998 |
| WO | WO-9931719 | 6/1999 |
| WO | WO-0014784 | 3/2000 |
| WO | WO-0118854 | 3/2001 |

| | | |
|---|---|---|
| WO | WO-0118855 | 3/2001 |
| WO | WO-0171786 | 9/2001 |
| WO | WO-0171791 | 9/2001 |
| WO | WO-01/73769 A1 | 10/2001 |
| WO | WO-0231869 A2 | 4/2002 |
| WO | WO-0242847 | 5/2002 |
| WO | WO-02086954 A1 | 10/2002 |
| WO | WO-02086955 | 10/2002 |
| WO | WO-03018882 A1 | 3/2003 |
| WO | WO-03046965 | 6/2003 |
| WO | WO-03084688 | 10/2003 |
| WO | WO-2004017379 A2 | 2/2004 |
| WO | WO-2004017380 A2 | 2/2004 |
| WO | WO-2004017381 | 2/2004 |
| WO | WO-2004017382 A2 | 2/2004 |
| WO | WO-2004075263 A2 | 9/2004 |
| WO | WO-2005/029551 | 3/2005 |
| WO | WO-2005029546 A2 | 3/2005 |
| WO | WO-2005029548 A2 | 3/2005 |
| WO | WO-2005029550 A2 | 3/2005 |
| WO | WO-2006/055003 A1 | 5/2006 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, I. W., "Laser Processing of Thin Films and Microstructures, Oxidation, Deposition and Etching of Insulators," (Springer—Verlag BerlinHeidelber, 1987.

Broadbent et al., "Excimer Laser Processing of Al-1 %Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," Journal of Appl. Phys., 82:4086 (1997).

Brotherton, "Polycrystalline Silicon Thin Film Transistors," Semicond. Sci. Tech., 10:721-738 (1995).

Brotherton, S.D., et al., Characterisation of poly-Si TFTs in Directionally Solidified SLS Si, Asia Display/IDW'01, p. 387-390.

Crowder et al., "Low-Temperature Single-Crystal Si TFT's Fabricated on Si Films Processed via Sequential Lateral Solidification," IEEE Electron Device Letter, 19 (8): 306 (1998).

Crowder et al., "Parametric Investigation of SLS-processed Polysilicon Thin Films for TFT Application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoernenos, P.A. Coxon, S. Friligkos, J. Antonopoulos and N.A. Economou, Effect of pressure on the growth of crystallites of low-pressure chemical-vapor-deposited polycrystalline silicon films and the effective electronmobility under high normal field in thin-film transistors, J. Appl. Phys. 73, 8402 (1993).

Endert et al., "Excimer Laser: A New Tool for Precision Micromachining," Optical and Quantum Electronics, 27:1319 (1995).

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven," J. Electro-Chem. Soc., 129: 2812 (1982).

Gosain et al., "Formation of (100)-Textured Si Film Using an Excimer Laser on a Glass Substrate," Jpn. J. Appl. Phys., vol. 42 (2003) pp. L135-L137.

Gupta et al., "Numerical Analysis of Excimer-laser induced melting and solidification of Si Thin Films", Applied Phys. Lett., 71:99, 1997.

Hau-Riege et al., "The Effects Microstructural Transitions at Width Transitions on Interconnect reliability," Journal of Applied Physics, 87(12): 8467-8472.

Hawkins, W.G. et al., "Origin of lamellae in radiatively melted silicon films," Appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im et al., "Controlled Super-Lateral Growth of Si Films for Microstructural Manipulation and Optimization," Phys. Stat. Sol. (a), 166:603 (1998).

Im et al., "Crystalline Si Films for Integrated Active-Matrix Liquid-Crystals Displays," MRS Bulletin, 21:39 (1996).

Im et al., "On the Super Lateral Growth Phenomenon Observed in Excimer Laser-Induced Crystallization of Thin Si Films," Appl. Phys. Lett., 64 (17): 2303 (1994).

Im et al., "Phase Transformation Mechanisms Involved in Excimer Laser Crystallization of Amorphous Silicon Films," Appl. Phys. Lett., 63 (14): 1969 (1993).

Im et al., "Single-Crystal Si Films for Thin-Film Transistor Devices," Appl. Phys. Lett., 70(25): 3434 (1997).

Im, J.S., Method and system for producing crystalline thin films with a uniform crystalline orientation, U.S. Appl. No. 60/503,419; ref. file # 36013(BB); Columbia ref. M02-063.

Ishida et al., "Ultra-shallow boxlike profiles fabricated by pulsed ultraviolet-laser doping process," J. Vac. Sci. Technol. B 12(1):399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No.. 4B, Apr. 2000.

Jeon et al., "Two-step laser recrystallization of poly-Si for effective control of grain boundaries," Journal of Non Crystalline Solids, 266-269: 645-649 (2000).

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358, 1995.

Kim et al., "Multiple Pulse Irradiation Effects in Excimer Laser-Induced Crystallization of Amorphous Si Films," Mat. Res. Sym. Proc., 321:665-670 (1994).

Kim, C. et al., Development of SLS-Based SOG Display, IDMC 2005, Thu-15-02, 252-255.

Kim, "Excimer-Laser-Induced Crystallization of Amorphous Silicon Thin Films," Ph. D. Dissertation Abstract, Columbia University, 1996.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.-J., et al., "The effects of dopants on surface-energy-driven secondary grain growth in silicon films," J. Appl. Phys. 67 (2), Jan. 15, 1990.

Kim, H.J. et al., "New Excimer-laser-crystallization method for producing large-grained and grain boundary-location-controlled Si Films for Thin Film Transistors", Applied Phys. Lett., 68: 1513.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657(1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180(1998).

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics,New York, US, 43(10): 946-948 (1983).

MICRO/LAS Lasersystem GMBH, "Overview of Beam Delivery Systems for Excimer Lasers," (1999).

MICRO/LAS Lasersystem GMBH, "UV Optics Systems for Excimer Laser Based Micromachining and Marking," (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).

Nebel, "Laser Interference Structuring of A-Si:h" Amorphous Silicon Technology—1996, San Francisco, CA Apr. 8-12, Materials Research Society Symposium Proceedings, vol. 420, Pittsburgh, PA (1996).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Sato et al., "Mobility anisotropy of electrons in inversion layers on oxidized silicon surfaces," Physical Review B (State) 4, 1950 (1971).

Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2," Appl. Phys. Lett., 69(19): 2864 (1996).

Sposili et al., "Single-Crystal Si Films via a Low-Substrate-Temperature Excimer-Laser Crystallization Method," Mat. Res. Soc. Symp. Proc., 452: 953-958 (1997).

Thompson, C.V. and H.I. Smith, Surface-energy-driven secondary grain growth in ultrathin (<100 nm) films of silicon, Appl. Phys. Lett. 44, 603 (1984).

van der Wilt, P.C. et al., "State-of-the-Art Laser Crystallization of Si for Flat Panel Displays," PhAST, May 18, 2004, pp. 1-34.

van der Wilt, P.C. et al., "The Commercialization of the SLS Technology," Taiwan FPD, Jun. 11, 2004, pp. 1-12.

van der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T. et al.: "Effect of process parameters on the structural characteristics of laterally grown, laser-annealed polycrystalline silicon films," Journal of applicaed Physics, vol. 94, No. 12, Dec. 15, 2003.

Voutsas, A.T., A new era of crystallization: advances in polysilicon crystallization and crystal engineering, Applied Surface Science 250-262, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications" Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

International Search Report and Written Opinion for corresponding International Patent Application No. PCT/US2010/055106.

International Search Report and Written Opinion for corresponding International Patent Application No. PCT/US2010/033565.

Andrä et al., "A new technology for crystalline silicon thin film solar cells on glass based on the laser crystallization," IEEE, pp. 217-220 (2000).

Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.

Sinke et al., "Explosive crystallization of amorphous silicon: Triggering and propagation," Applied Surface Science, vol. 43, pp. 128-135 (1989).

Van Der Wilt, "A hybrid approach for obtaining orientation-controlled single-crystal Si regions on glass substrates," Proc. of SPIE vol. 6106, 61060B-1 to B-15, (2006).

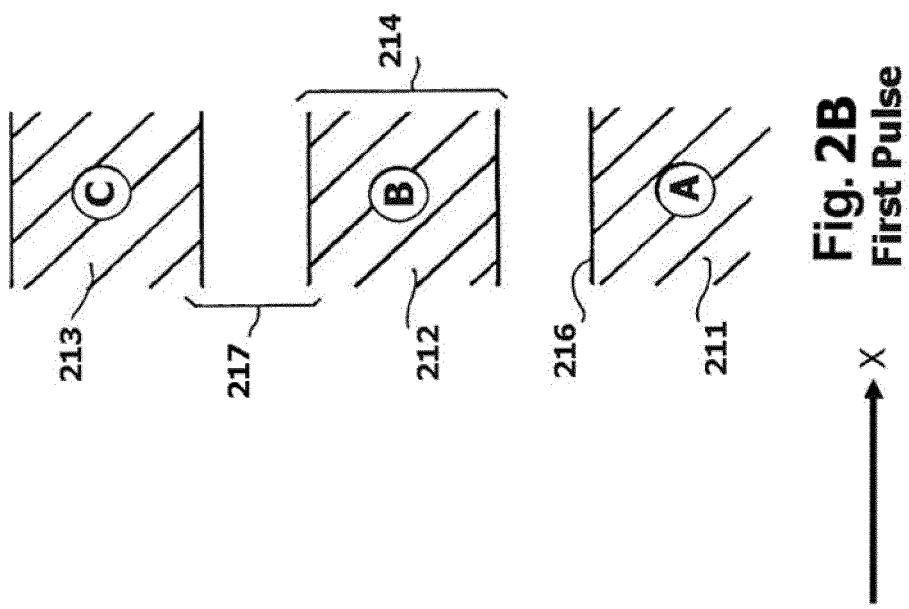

Second Pulse

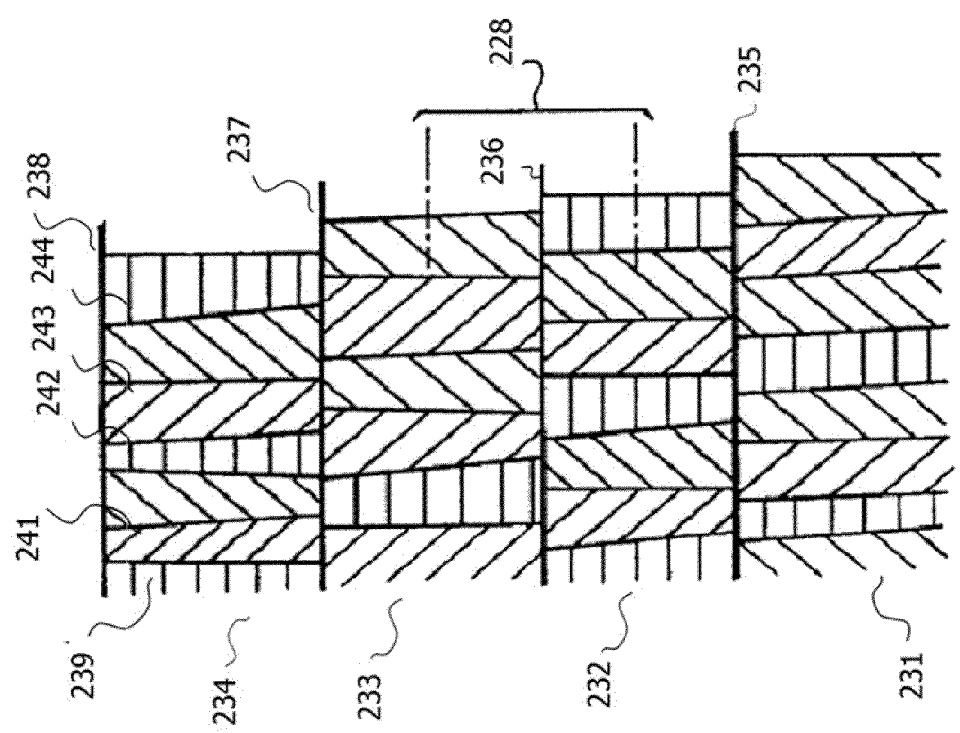

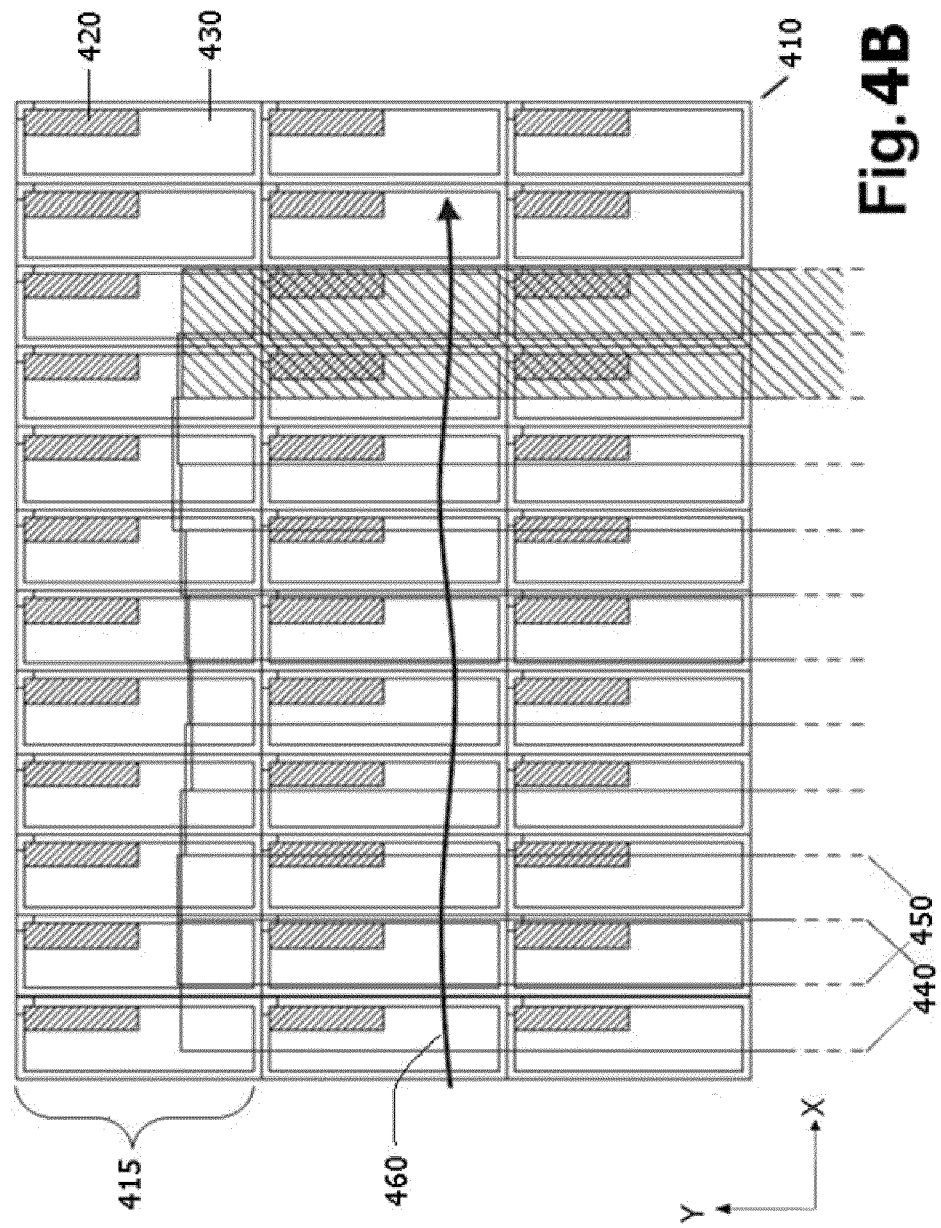

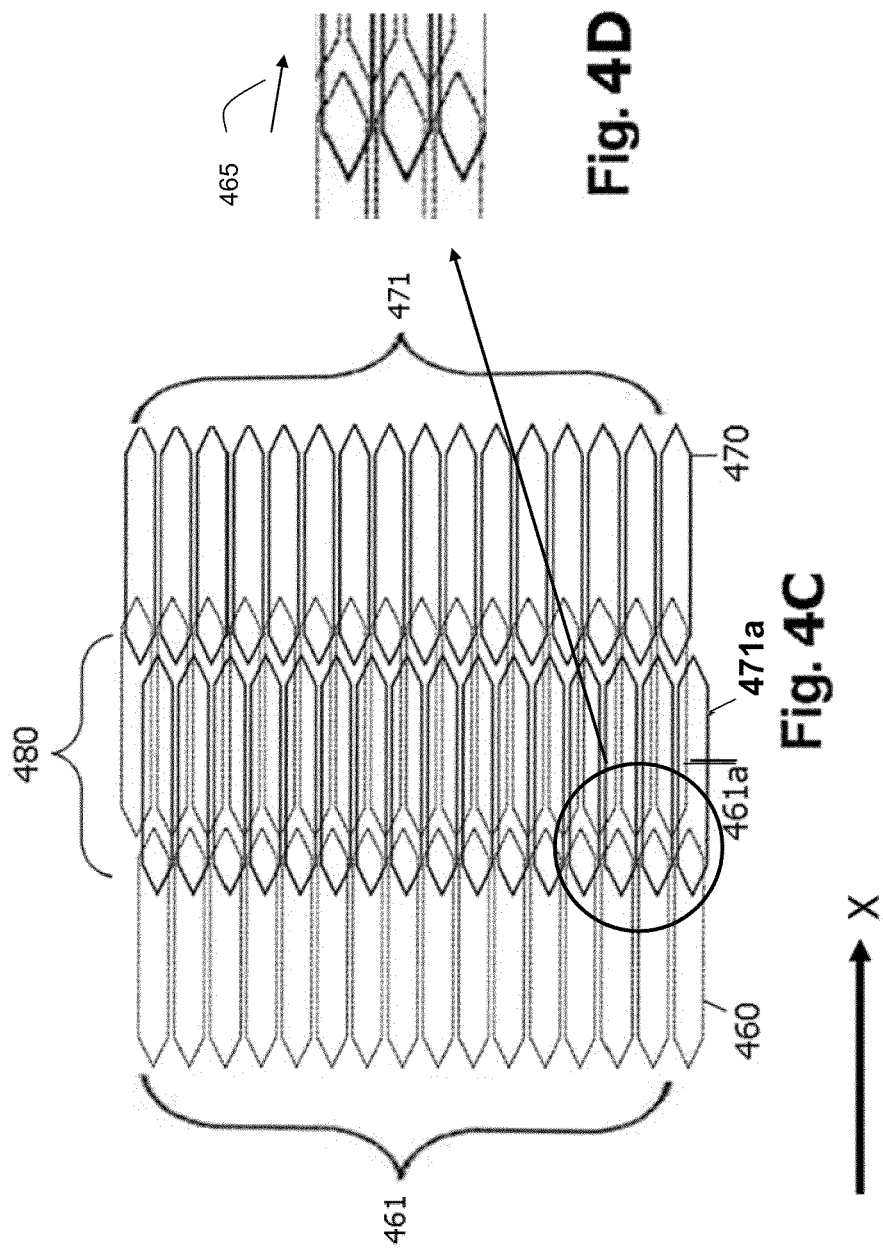

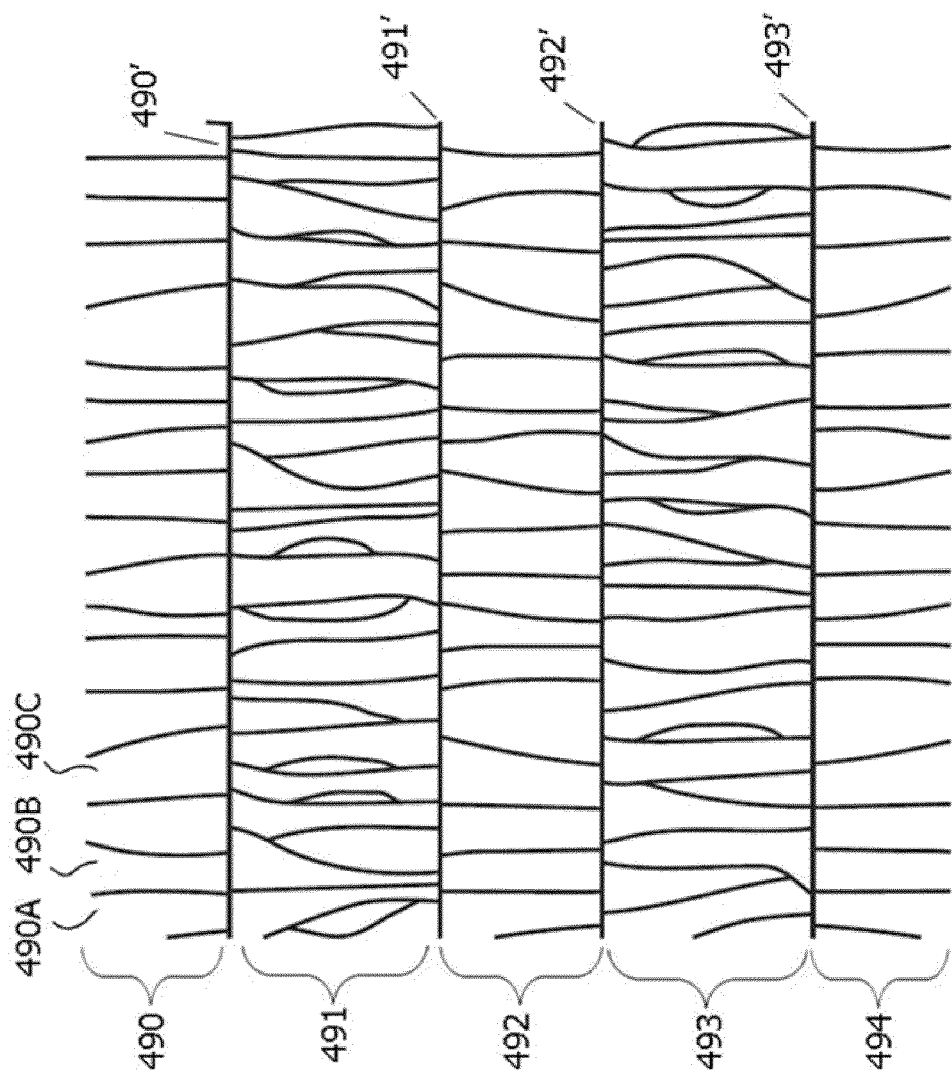

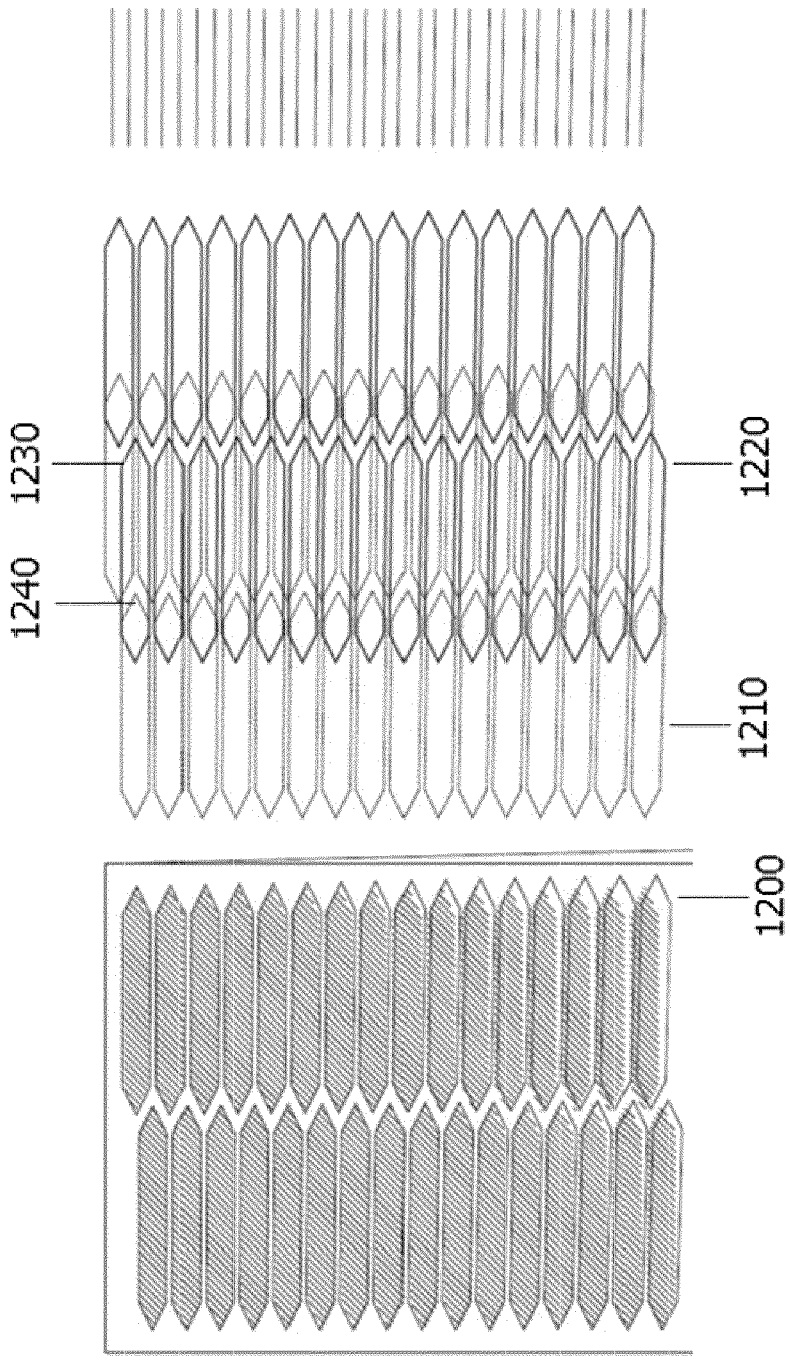

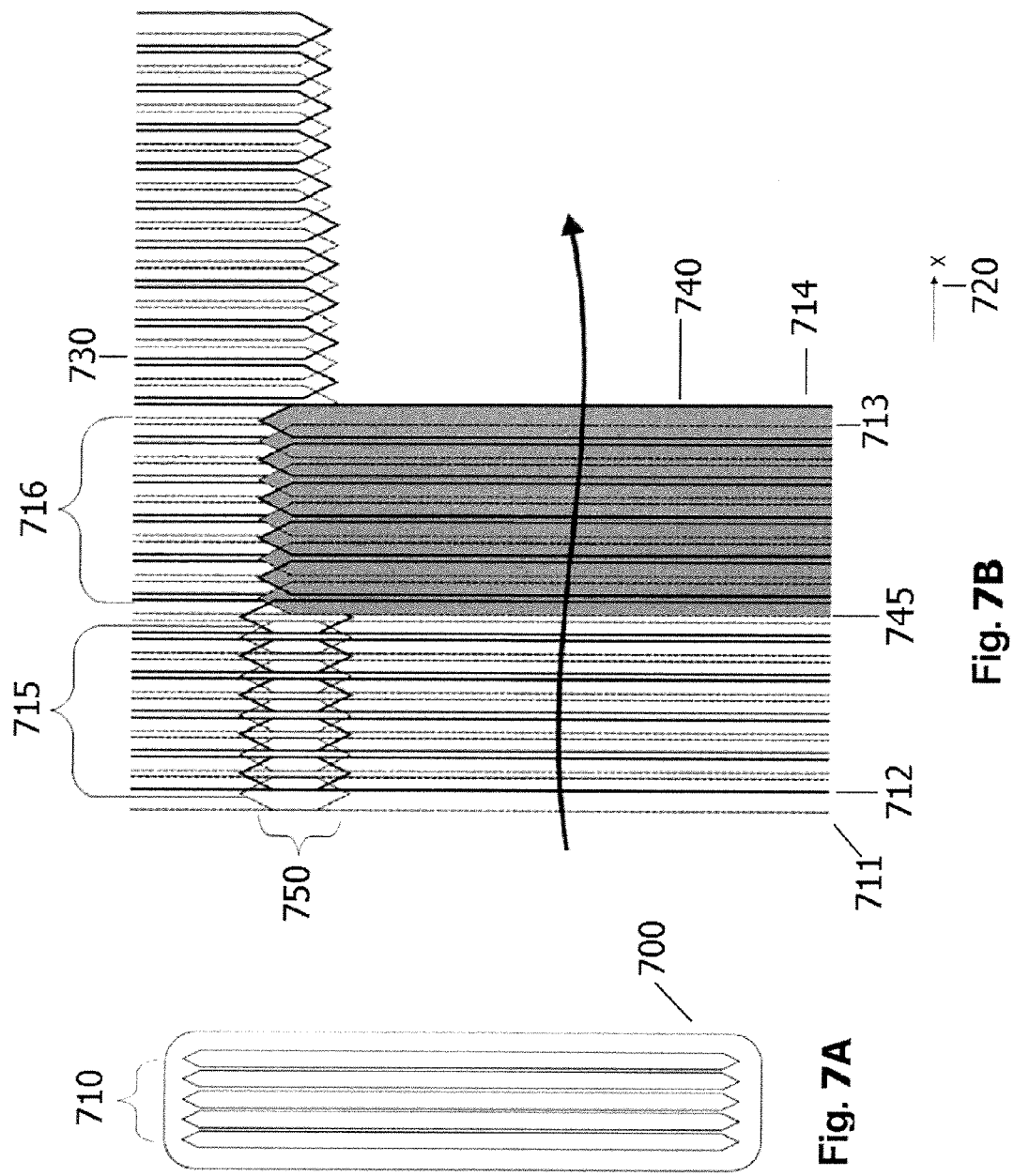

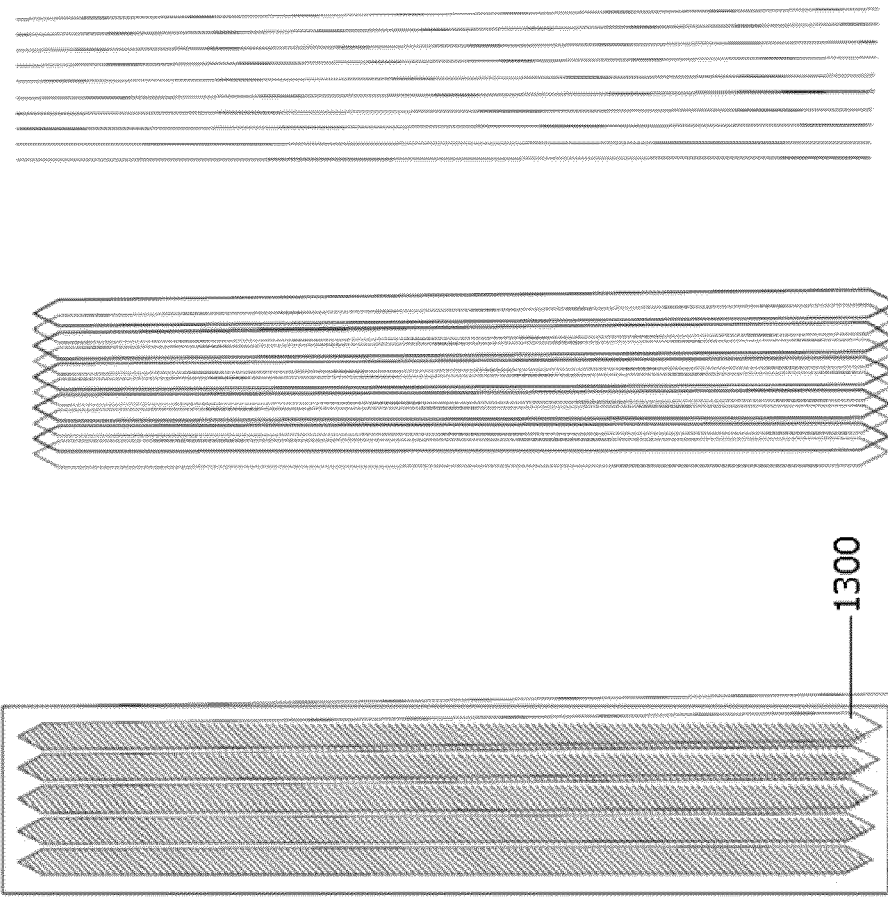

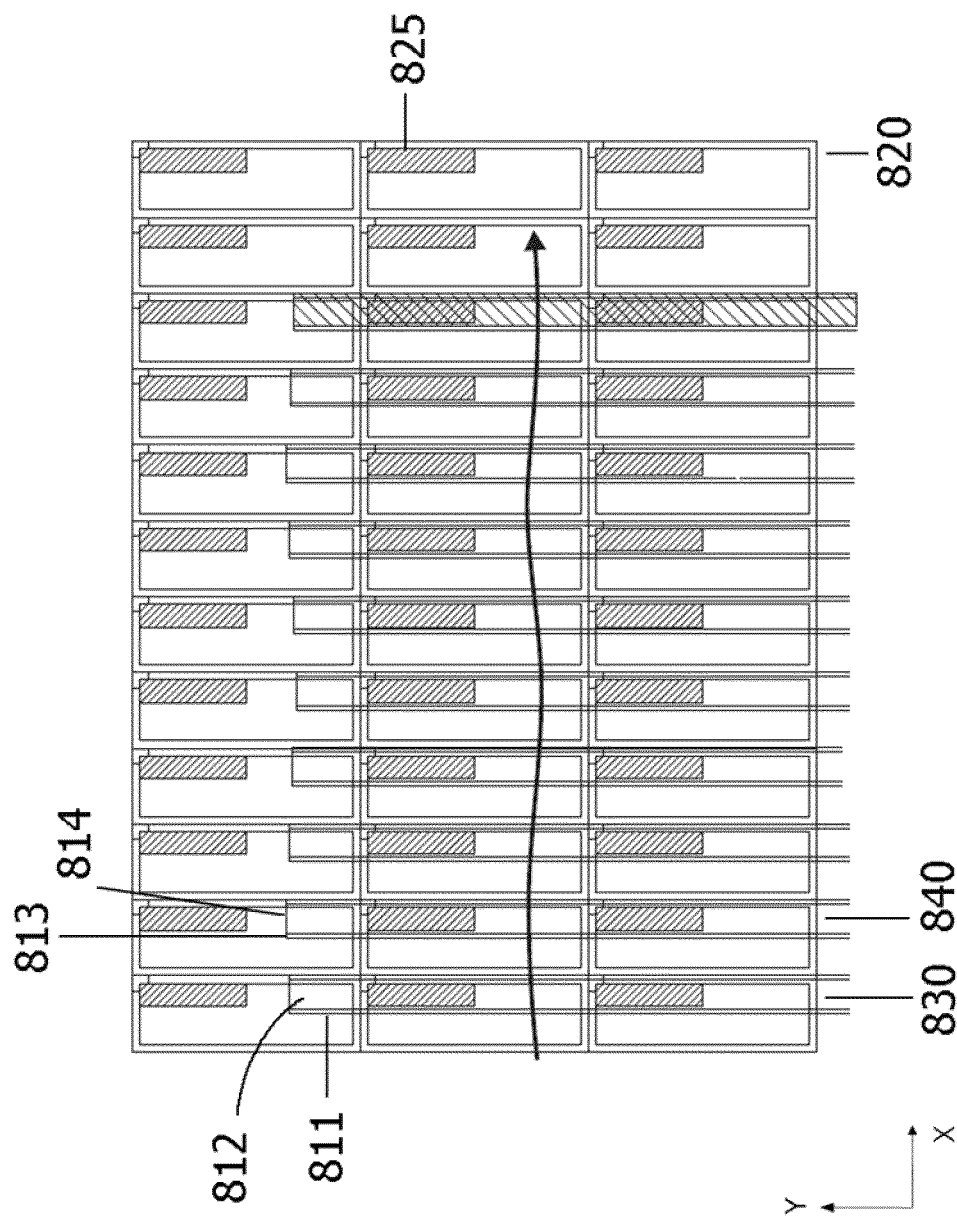

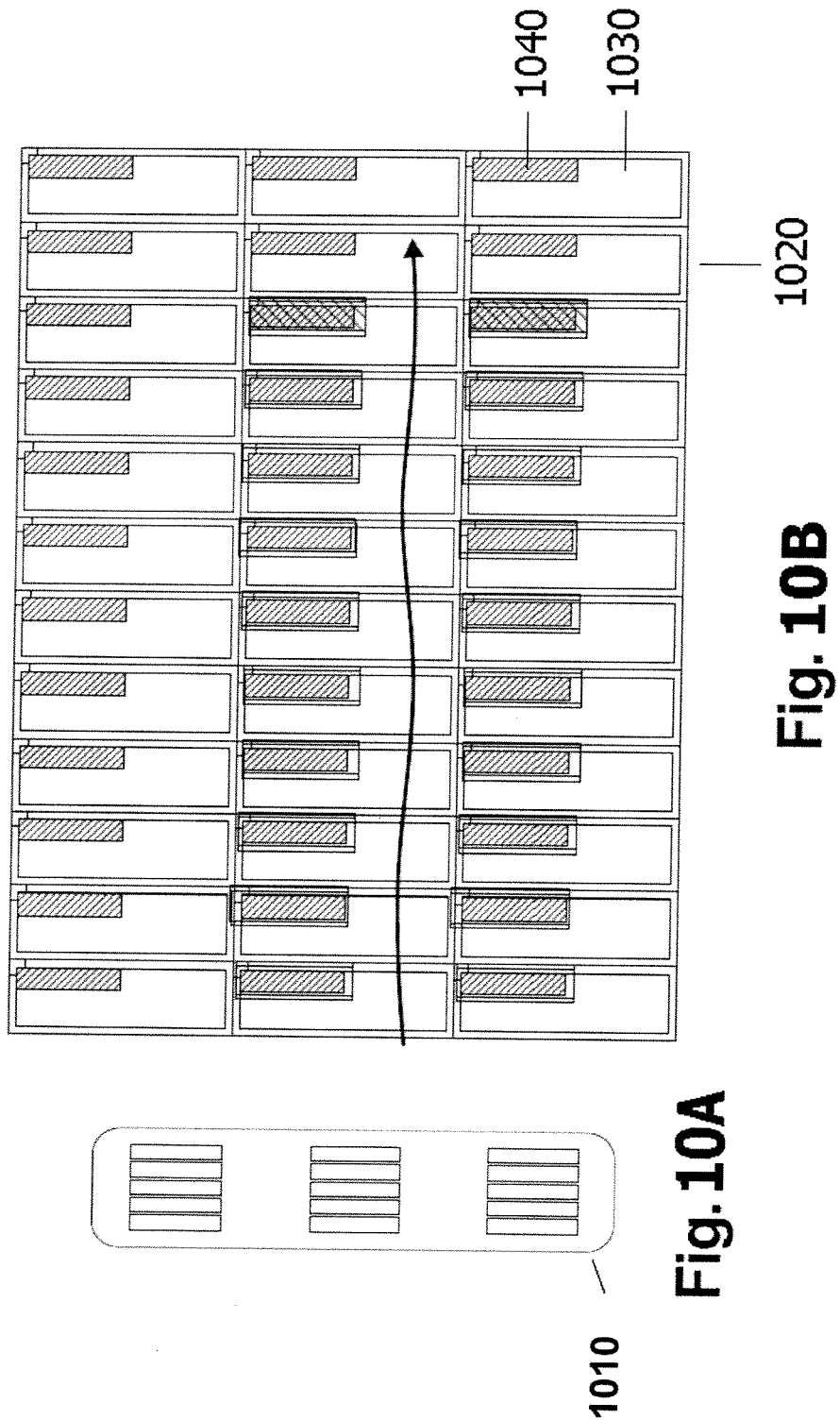

SYSTEMS AND METHODS FOR NON-PERIODIC PULSE SEQUENTIAL LATERAL SOLIDIFICATION

CROSS REFERENCE TO RELATED APPLICATIONS

This application is a continuation of International Patent Application No. PCT/US10/33565, filed May 4, 2010, which claims priority under 35 U.S.C. 119(e) to U.S. Application Ser. No. 61/294,288, filed on Jan. 12, 2010 and to U.S. Application Ser. No. 61/291,663, filed on Dec. 31, 2009. Also, this application claims priority under 35 U.S.C. 119(e) to U.S. application Ser. No. 61/264,082, filed on Nov. 24, 2009, U.S. application Ser. No. 61/286,643, filed Dec. 15, 2009 and to U.S. application Ser. No. 61/291,488, filed on Dec. 31, 2009. The entirety of each of the disclosures of which are explicitly incorporated by reference herein.

All patents, patent applications, patent publications and publications cited herein are explicitly incorporated by reference herein in their entirety. In the event of a conflict between the teachings of the application and the teachings of the incorporated document, the teachings of the application shall control.

BACKGROUND

In the field of semiconductor processing, a number of techniques have been described to convert thin amorphous silicon films into polycrystalline films. One such technique is sequential lateral solidification ("SLS"). SLS is a pulsed-laser crystallization process that can produce polycrystalline films having elongated crystal grains on substrates, such as, but not limited to, substrates that are intolerant to heat (e.g., glass and plastics). Examples of SLS systems and processes are described in commonly-owned U.S. Pat. Nos. 6,322,625, 6,368,945, 6,555,449, and 6,573,531, the entire contents of which are incorporated herein by reference.

SLS uses location controlled laser pulses to melt a region of an amorphous or polycrystalline thin film on a substrate. The melted regions of film then laterally crystallize into a directionally solidified microstructure or a multitude of location-controlled large single-crystal regions. Generally, the melt/crystallization process is sequentially repeated over the surface of a thin film. One or more devices, such as image sensors, active-matrix liquid crystal displays ("AMLCD"), and active-matrix organic light-emitting diode (AMOLED) display devices, can then be fabricated from the crystallized film. In the AMLCD and AMOLED display devices, a regular array of thin-film transistors ("TFTs") or TFT circuits is fabricated on a transparent substrate, and each transistor or circuit serves as a pixel controller.

In conventional SLS systems, one factor in successful crystallization is the precision of the stages that translate the sample with respect to the laser pulses. For current Gen-4 two dimensional ("2D")-projection SLS systems, translation velocities of the stages are on the order of tens of cm/s, for example, 18 cm/s. Stages such as these have certain deviations from a perfectly straight line of motion. That deviation will be collectively referred to herein as stage wobble. As used herein, "stage wobble" refers to variations and deviations of the stage position from its intended position as it translates in the laser path. Such variations can be, for example, when the stage is moving in the x-direction, unintended small motion of the stage in the y-direction. A 2D projection system creates a two dimensionally patterned beam for performing SLS. Other methods can create line beams for performing SLS.

One issue related to stage wobble in conventional single-scan two-shot SLS is the non-equidistant spacing of long grain boundaries in material made from two sequential laser pulses, i.e., a two-shot material. A single scan SLS process refers to an SLS process that can fully crystallize a region on a substrate in a single scan. Two-shot SLS refers to a SLS process that fully crystallizes a given portion of such a region with two laser pulses. The wobble of the stages between two pulses can result in a non symmetric overlapping of the second pulse with the first pulse. Ideally, beamlets of the second pulse are centered between regions irradiated by beamlets of the first pulse so as to achieve a constant spacing between the grain boundaries created by the two-shot process. If the beamlets of the second pulse are not well positioned because of stage wobble, the grains in one column can be shorter than in the grains in a neighboring column and many grains can remain in the wider column that are not fully extending the width of the column (e.g., occluded grains). Furthermore, beamlet distortion, caused by various aberrations in the projection optics, also may result in locally non symmetric overlapping of the second pulse in the scan. As used herein "beam distortion" refers to aberrations in the projection optics that can result in non-uniform beamlet formation.

SUMMARY

A non-periodic pulse SLS method and tool is described using position controlled sequential triggering of lasers. The system can implemented multiple lasers or a single laser to create distinct non-periodic laser pulses in the crystallization process, i.e., distinct in that each laser pulse results in a separate melting and solidification cycle. One or more lasers are used in a coordinated pulse sequence to irradiate and crystallize selected areas of a film in a single scan. For example, the rapid sequence of laser pulses from two different laser sources provides the capability of increasing the effective pulse rate in processing a local region, as compared to a single source pulse rate. It also permits a greater overlap between successive pulses without the need to decrease the stage translation speed. The overlap region of the film between the pulses from the two lasers can be greater than 70% or 95% and in some instances greater than 99% percent. This high degree of overlap can be used to alleviate issues of stage wobble and laser beam distortion.

In any of the embodiments, the disclosed systems and method for non-periodic pulse sequential lateral solidification relate to processing a thin film. The method for processing a thin film, while advancing a thin film in a selected direction, includes irradiating a first region of the thin film with a first laser pulse and a second laser pulse and irradiating a second region of the thin film with a third laser pulse and a fourth laser pulse, wherein the time interval between the first laser pulse and the second laser pulse is less than half the time interval between the first laser pulse and the third laser pulse. In some embodiments, each pulse provides a shaped beam and has a fluence that is sufficient to melt the thin film throughout its thickness to form molten zones that laterally crystallize upon cooling. In some embodiments, the first and second regions are adjacent to each other. In some embodiments, the first and second regions are spaced a distance apart.

In any of the embodiments, a first laser source generates the first laser pulse and the third laser pulse and a second laser source generates the second laser pulse and the fourth laser pulse. In some embodiments, the first and second laser sources pulse at a constant rate. In some embodiments, the first and second lasers are the same. In some embodiments, the first and second lasers are different. In some embodiment, the thin film is continuously advanced in the selected direction.

In any of the embodiments, the beams provided from each of the first and second laser pulses overlap in the first region of the thin film and the beams provided from each of the third and fourth laser pulses overlap in the second region of the thin film. The overlap in each of the regions can be greater than 90% overlap, for example, greater than 95% or greater than 99%.

In any of the, the shaped beam is obtained by directing laser pulses through a mask and/or includes a plurality of beamlets. In some embodiments, the beamlets can be positioned at an angle relative to an edge of the film. In some embodiments, an edge of the film can be positioned at an angle relative to the scan direction. In some embodiments, the shaped beam can be a dot pattern.

In any of the embodiments, the first and second regions are spaced apart from one another and separated by an unirradiated area of the film. In some embodiments, the first and second regions overlap, for example, by 10% or 1%.

In any of the embodiments, an electronic device is fabricated in each of the first region and the second region and the regions are sized to contain one circuit belonging to a node of a matrix-type electronic device.

In one aspect, the disclosure relates to a thin film processed according to the method described. The thin film can be used to make electronic devices including devices having thin film transistors in each of the first and second regions of the film.

In one aspect, the disclosure relates to a method for processing a thin film, while advancing the film at a constant velocity in a selected direction, including irradiating a first region of the thin film by a first beam provided by a laser pulse from a primary laser source, irradiating a second region of the thin film by a second beam provided by a laser pulse from a secondary laser source and irradiating a third region of the thin film by a third beam provided by a laser pulse from the primary laser source. In some embodiments, each beam of the first, second, and third beams has a fluence that is sufficient to melt a film throughout its thickness in an irradiated film region and laterally crystallize upon cooling to form one or more laterally grown crystals, and the overlap in irradiation between the first and second regions is larger than the overlap in irradiation between the second and third regions.

In one aspect, the disclosure relates to method for processing a thin film while advancing the thin film in a selected direction. The method can include at a first time, generating a first shaped beamlet from a laser pulse from a primary laser source and irradiating a first region of the film with the first shaped beamlet to form a first molten zone which laterally crystallizes upon cooling to form a first set of crystallized regions; at a second time, generating a second shaped beamlet from a laser pulse from a secondary laser source and irradiating the first region of the film with the second shaped beamlet to form a second molten zone which laterally crystallizes upon cooling to form a second set of crystallized regions; and at a third time, generating a third shaped beamlet from another laser pulse from the primary laser source and irradiating a second region of the film with the third shaped beamlet to form a third molten zone which laterally crystallizes upon cooling to form a third set of crystallized regions. In some embodiments, the time interval between the first time and the third time is more than two times the interval between the first time and the second time.

In one aspect, the disclosure relates to a system for processing a thin film including primary and secondary laser sources for generating laser pulses, a system for generating a shaped beamlet from the laser pulse, a work surface for securing a thin film on a substrate, a stage for moving the thin film with respect to the beam pulses and thereby creating a propagation direction of the laser beam pulses on the surface of the thin film, and a computer for processing instructions for stage synchronized laser pulsing to provide a first region of a thin film loaded into the moveable stage to be irradiated by a first set of one or more shaped beamlets provided by a laser pulse from the primary source, a second region of the thin film to be irradiated by a second set of one or more shaped beamlets provided by a laser pulse from the secondary source, and a third region of the thin film to be irradiated by a third set of one or more shaped beamlets provided by a laser pulse from the primary source. In some embodiments, the processing instructions are provided for moving the film with respect to the beam pulses in the propagation direction to irradiate the first and second regions and wherein the overlap in irradiation between the first and second regions is greater than the overlap in irradiation between the second and third regions. In some embodiments the system also includes a system for sample alignment.

BRIEF DESCRIPTION OF THE DRAWINGS

The following description will be more readily understood with references to the following drawings in which:

FIGS. 2B-2D illustrate an SLS process;

FIG. 4B-4E depicts a two-shot scan of an array of pixels using a two-shot SLS process;

FIG. 4F-4H depict distortion in beamlet formation using the mask depicted in FIG. 4A;

FIG. 7A depicts a vertical mask used for a non-periodic pulse SLS process, according to embodiments of the present disclosure;

FIG. 7B depicts a two shot scan in a non-periodic pulse SLS process, according to embodiments of the present disclosure;

FIGS. 7F-7H depict distortion in a non-periodic pulse SLS process, according to embodiments of the present disclosure;

FIG. 8 depicts a selective area crystallization non-periodic pulse SLS process, according to embodiments of the present disclosure;

FIG. 10A depicts a mask for us in a selective area crystallization non-periodic pulse SLS process, according to embodiments of the present disclosure; and FIG. 10B depicts a selective area crystallization non-periodic pulse SLS process, according to embodiments of the present disclosure.

DESCRIPTION

A non-periodic pulse SLS method and tool is described using position controlled sequential triggering of multiple lasers. The multiple lasers can create distinct non-periodic laser pulses in the crystallization process, i.e., distinct in that each laser pulse results in a separate melting and solidification cycle. Two or more lasers are used in a coordinated pulse sequence to irradiate and crystallize selected areas of a film in a single scan. The rapid sequence of laser pulses from two different laser sources provides the capability of increasing the effective pulse rate in processing a local region, as compared to a single source pulse rate. It also permits a greater overlap between successive pulses without the need to decrease the stage translation speed. The overlap region of the film between the pulses from the two lasers can be greater than 70% or 95% and in some instances greater than 99% percent. This high degree of overlap can be used to alleviate issues of stage wobble and laser beam distortion.

Figure 5A:
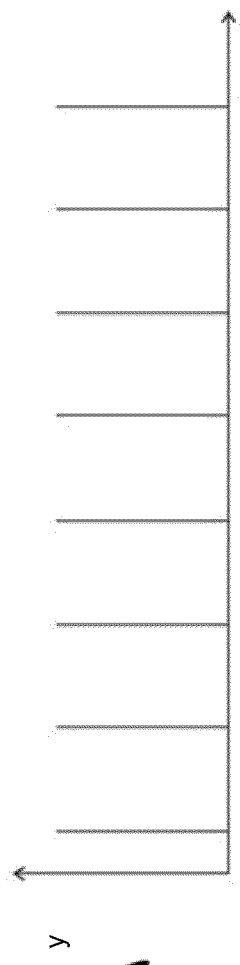
FIG. 5A is a graphical depiction of time vs. pulse energy in a conventional two shot SLS processes.
Figure 5B:
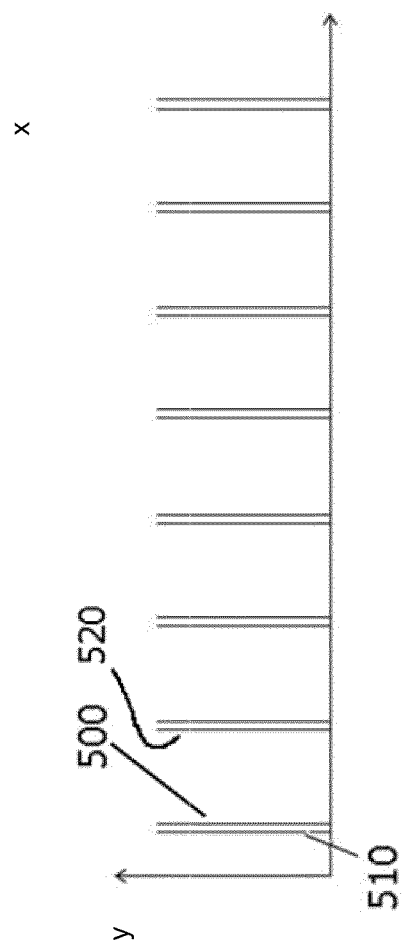
FIG. 5B is a graphical depiction of time vs. pulse energy for the selective advanced two shot SLS process, according to embodiments of the present disclosure.
Figure 5C:
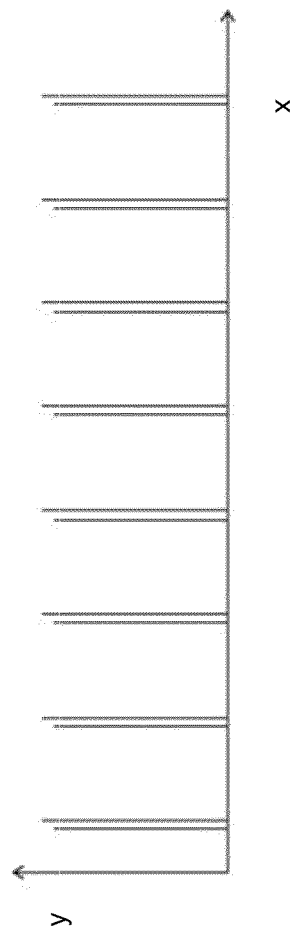
FIG. 5C is a graphical depiction of time vs. pulse energy for the selective advanced two shot SLS process where the second pulse has a greater energy than the first pulse, according to embodiments of the present disclosure.

Further, the non-periodic pulse SLS method and tool also can be used to perform selective area crystallization (SAC) of a film in order to crystallize only those areas of the film that will be formed into electronics. The non-periodic pulse SLS method and tool provides SAC by allowing overlap and in some cases substantial overlap (i.e., greater than 70% overlap) between the first pulses of the two or more lasers, resulting in elongated crystal growth in a first region of the film, followed by a break determined by the repetition rate of the lasers and then substantial overlap in the second pulses of the two or more lasers resulting in elongated crystal growth in a second region of the film. The timing between laser pulses giving rise to non periodic laser pulse sequences and substantial overlap in irradiated regions is illustrated in FIGS. 5A-5C, which is discussed in detail below. Such methods and systems can be used for conventional two dimensional projection SLS processes at high throughput.

Low-temperature polycrystalline Si (LTPS) technology is anticipated to be necessary for making large-diameter AMOLED displays with sufficient brightness and/or lifetime. SLS is one of laser-based LTPS technologies that are of interest to this development and, correspondingly, SLS systems are thus anticipated to need larger stages to process larger panels as well as have more laser power to achieve sufficient throughput (higher pulse repetition rates and/or higher energy per pulse). While faster stages and higher pulse repetition rates alone may already be beneficial in reducing the wobble and the effects thereof on the microstructure (inertness of the stages and less time between pulses), the need for larger stages and smaller grains will make stage design challenging and stages expensive. Non-periodic pulsing, on the other hand, can drastically reduce the time between two consecutive overlapping pulses to the point that there is virtually no change in stage deviation between two pulses, while significantly reducing stage design challenges.

Increasing the overlap between pulses has certain advantages in reducing the negative impact of stage wobble and image distortion on the proper overlap between beamlets therein. Non periodic pulse SLS can be implemented using beamlets oriented in any direction, with respect to the stage motion. In practice, however, beamlets that are oriented vertically, e.g., perpendicular to the direction of stage translation, can be used to provide increased pulse overlap, and thereby derive greater benefit from the method. For an SLS scheme using long rectangular beamlets, such as the two-shot SLS process, the largest degree of pulse overlap can be established by using predominantly vertically oriented beamlets. While horizontal beamlets may be used in accordance with the described non-periodic pulse SLS method, the use of vertical beamlets is preferred to achieve a high degree of overlap between pulses. Vertical beamlet alignment has been described in "Systems and Methods for Uniform Sequential Lateral Solidification of Thin Films Using High Frequency Lasers," U.S. patent application Ser. No. 12/063,814, the entirety of the disclosure is explicitly incorporated by reference herein.

Figure 1:
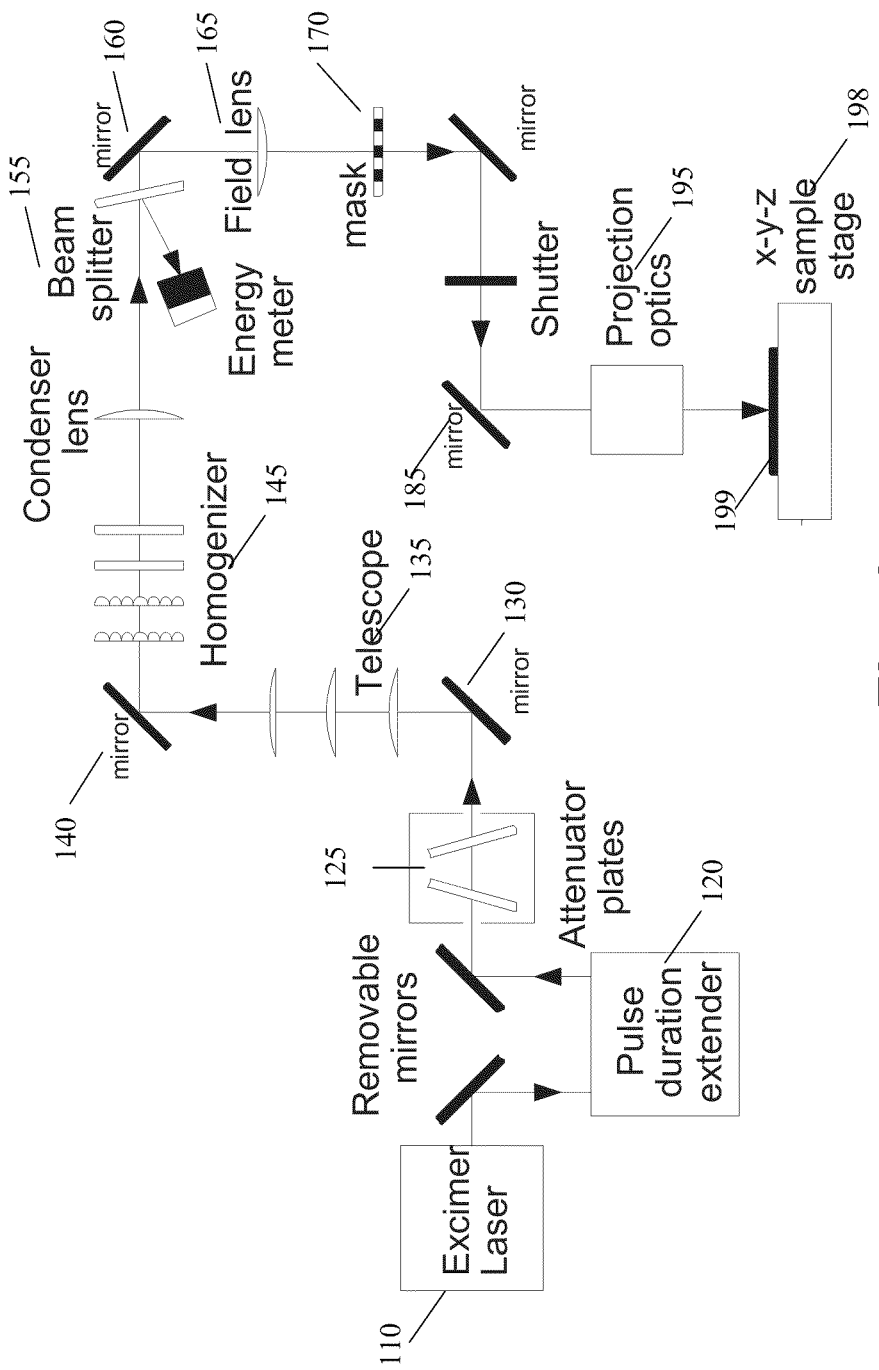
FIG. 1 depicts a system used for a sequential lateral solidification (SLS) process.

A single scan two-shot SLS is first described in order to better explain the features and advantages of non-periodic pulse SLS. FIG. 1 shows an example of a system that can be used for 2D SLS processes. A light source, e.g., an excimer laser 110, generates a pulsed laser beam which passes through a pulse duration extender 120 and attenuator plates 125 prior to passing through optical elements such as mirrors 130, 140, 160, telescope 135, homogenizer 145, beam splitter 155, and lens 165. The laser beam pulses then pass through a mask 170, which may be on a translation stage (not shown), and projection optics 195. The projection optics reduce the size of the laser beam and simultaneously increases the intensity of the optical energy striking film 199 at a desired location(s). The film 199 is provided on a precision x-y-z stage 198 that can accurately position the film 199 under the beam and assist in focusing or defocusing the image of the mask 170 produced by the laser beam at the desired location on the film 199. In some embodiments, the stage can include mechanics for moving a work surface (upon which the substrate is placed) and/or the projection lenses, such that the substrate and the projection lenses can move with respect to each other.

Laser crystallization systems that can be used in SLS processes have characteristics largely dictated by the laser source. For example, a high frequency laser (several kHz or more up to tens of kHz or more) with a low energy per pulse can be used to create a long narrow line to perform what is called "line-scan SLS." The beam length is typically larger than the dimension of one or more displays and can be a fraction or equal to the dimension of a glass panel of which displays are cut. A fraction can be about one half to about one sixteenth of the panel, for example, one quarter of the panel. Lower frequency lasers having high power (for example 300 Hz or 600 Hz or more and 300 W or 600 W or more) are not amenable for this line-scan SLS scheme as the per-pulse energy is too high (on the order of 1 J) and instead rectangular beams are formed that are scanned in a serpentine style over the surface of the film. A particular type of SLS system using such lasers, as for example available from Japan Steel Works, LTD., Japan, uses a two-dimensional (2-D) projection system to generate the rectangular laser pulses with a typical short axis dimension of approximately 0.5 mm to 2.0 mm and a typical long axis dimension of approximately 15 mm to 30 mm. At least one dimension of the molten zones used for sequential lateral solidification is on the order of one to two times the lateral grain growth, e.g., about 2 µm to 6 µm. Hence, the rectangular laser beam may be masked to provide a plurality of such beamlets of smaller dimension. A plurality of beamlets of the appropriate dimension also can be provided using other means of optical manipulation of the beam instead of using a mask, such as generating an interference pattern that creates a light pattern similar to the mask.

In one SLS scheme using such plurality of beamlets that leads to a crystalline film with a high level of uniformity, a given region of a thin film is irradiated with two distinct laser pulses to fully crystallize the film, providing a relatively rapid way to produce polycrystalline semiconductor films. This scheme is commonly referred to as two-shot SLS. Further details of two-shot and other SLS methods and systems may be found in U.S. Pat. No. 6,368,945, entitled "Method and System for Providing a Continuous Motion Sequential Lateral Solidification," the entire contents of which are incorporated herein by reference. Two-shot SLS can be performed in a single scan, referred to as single-scan SLS, where the beam pulse is patterned into arrays of beamlets, the long axes of which are typically aligned parallel to the scan direction, as discussed in U.S. Pat. No. 6,908,835, entitled "Method and System for Providing a Single-Scan, Continuous Motion Sequential Lateral Solidification," the entirety of the disclosure of which is explicitly incorporated by reference herein.

Figure 2A:
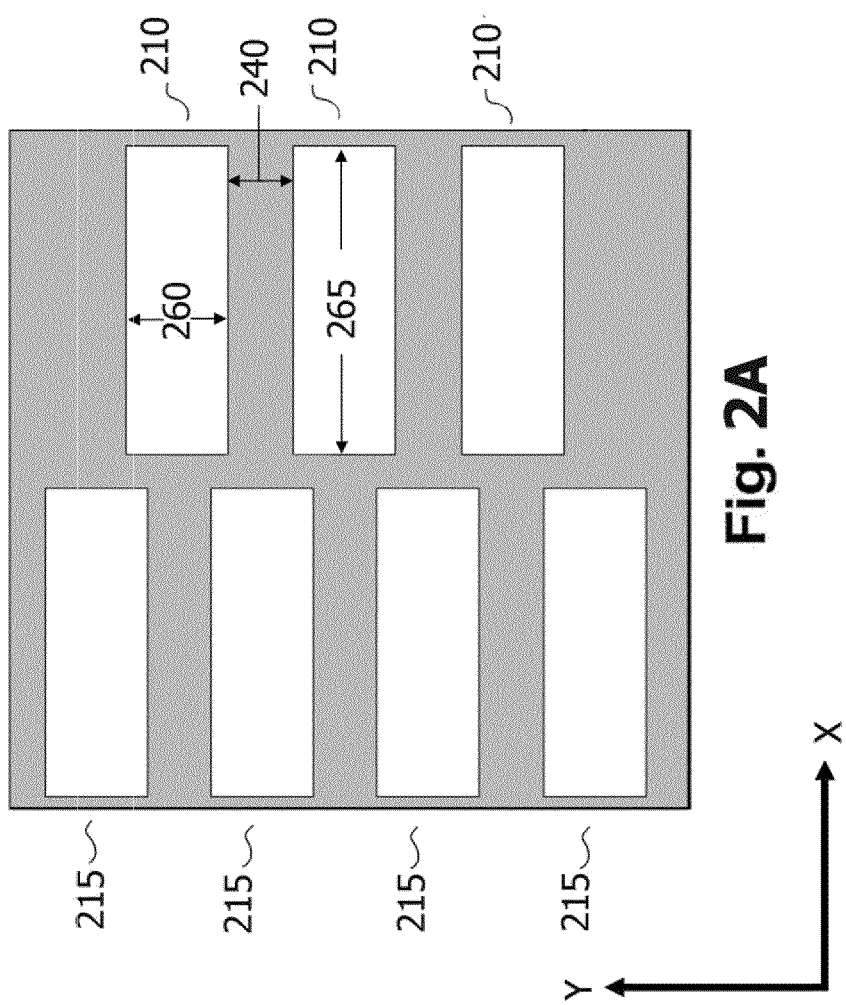
FIG. 2A depicts a mask used in an SLS process.

FIG. 2A illustrates a mask such as that described in U.S. Pat. No. 6,908,835, that can be used in a SLS scheme using the system of FIG. 1 for a single-scan, continuous motion SLS process. The mask includes a dual array 210, 215 of a plurality of rectangular slits, which transmit and shape the laser beam to produce a plurality of beamlets that irradiate the thin film. The other (non-slit) portions of the mask are opaque. The mask can be fabricated from a transparent substrate (e.g., quartz) and include a metallic or dielectric coating that is etched by conventional techniques to form a mask having features of any shape or dimension. It should be understood that the mask illustration is intended to be schematic only, and that the dimensions and aspect ratios of the slits can vary greatly and are related to the desired speed of processing, the energy density needed to melt the film in an irradiated region, and the available energy per pulse. One set of slits 210 is offset in the x and y axes from a second set of slits 215. In general, the aspect ratio of width to length for a given slit can vary, e.g., between 1:5 and 1:200 or more. The length 265 of the mask features is chosen to be commensurate with the dimensions of the device that is to be fabricated on the substrate surface. The width 260 and the spacing 240 of the mask features also may vary. In some embodiments, the width 260 is chosen to be small enough to avoid small grain nucleation within the melt zone, yet large enough to maximize lateral crystalline growth for each laser pulse. By way of example only, the mask feature can have a length 265 of between about 25 and 1000 micrometers (μm) and a width 260 of between about two and five micrometers (μm), each of which can be multiplied by any demagnification factor that occurs in the subsequent projection optics, e.g., a demagnification of between 4 and 6 times.

In operation, a stage moves the film continuously in the negative x direction, so that the long axes of the slits in the mask of FIG. 2A lie substantially parallel to the scan direction. As the film moves, the laser generates pulses at a given frequency, e.g., 300 Hz, which are shaped by the mask. The film velocity, e.g., stage velocity, is selected so that as it moves, the beamlets within subsequent laser pulses overlap.

Figure 2C:
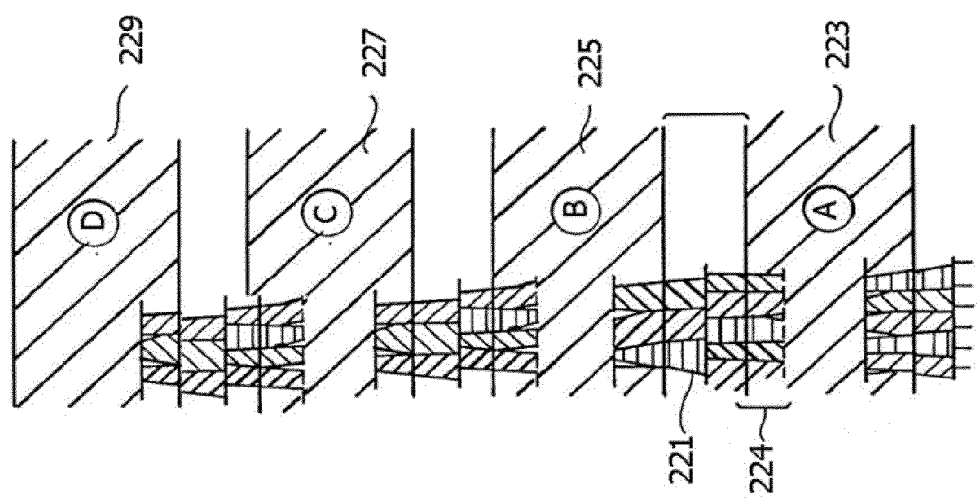

FIGS. 2B-2D depict a two shot SLS process using a mask such as that shown in FIG. 2A, focusing on a region of the film that shows the overlap between irradiations corresponding to the second (right) set of the dual array of slits 210 and the first (left) set of the dual array of slits 215 as the film is scanned in the negative x-direction. In this example, the mask slits 210 have a width 260 of about 5 μm and are each spaced apart by spacing 240 of about 2 μm. During a first pulse, a region in the film is irradiated with a first laser pulse. As shown in FIG. 2B, the region is irradiated with a first set of beamlets from the second array 210 of the mask and the laser pulse melts regions 211, 212, 213 on the sample, where each melt region 214 is approximately 5 μm wide and is spaced approximately 2 μm apart 217, each of which can be multiplied by any demagnification factor that occurs in the subsequent projection optics, e.g., a demagnification of between 4 and 6 times. This first laser pulse induces crystal growth in the irradiated regions 211, 212, 213 starting from melt boundaries 216 and proceeding into the melt region, so that polycrystalline silicon 221 forms in the irradiated regions, as shown in FIG. 2C.

The film continues to translate in the x direction and the second irradiation, resulting from irradiating the region with a second set of beamlets from the first array 215 of the mask, melts the remaining amorphous regions 223, 225, 227, 229 (shown in FIG. 2C) spanning the recently crystallized region 221 and initial crystal seed region 224 to melt. As shown in FIG. 2D, the crystal structure that forms the central section 228 outwardly grows upon solidification of the melted regions, so that a uniform long grain polycrystalline silicon region is formed. Further, FIG. 2D depicts four crystallographic columns 231, 232, 233, and 234 each separated from the other by long grain boundaries 235, 236, 237, and 238. The long grain boundaries 235, 236, 237, and 238 correspond to the center of each molten region. Within each of these crystallographic columns are found multiple substantially parallel laterally grown crystals 239, 241, 242, 243, 244.

Figure 3:
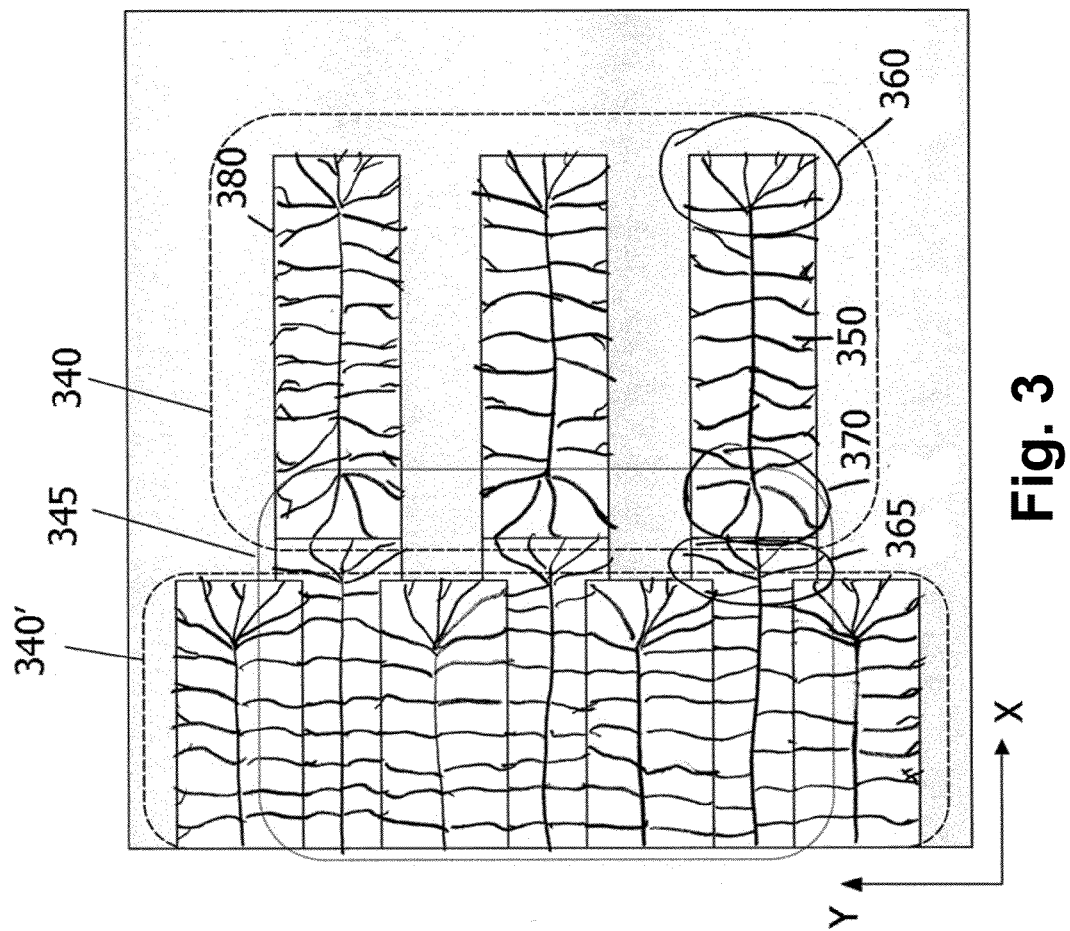
FIG. 3 depicts a two-shot scan using a two-shot SLS processes.

FIG. 3 shows an exemplary illustration of a film that has been irradiated by two subsequent laser pulses. As discussed above, where a beamlet irradiates and thus melts an individual irradiated region 380 in a given row, upon cooling the crystals in that region grow from the edge of the region towards the middle of the region. Thus, in the central region 350 of the irradiated region, where the edges of the beamlet were aligned in the x direction (parallel to the scan), and the crystal grains extend substantially in the y direction (perpendicular to the scan). The film includes a first set of crystallized regions 345 that have been irradiated with a first pulse shaped by the mask of FIG. 2A into a first set of beamlets (corresponding to slits 215), and second pulse shaped by the mask of FIG. 2A into a second set of beamlets 340 (also corresponding to slits 215), as the film moves in the negative x-direction and the scan thus progresses in the positive x-direction. When scanning the sample, the end portion crystal grains 370 of the second set of crystallized regions 340, generated by a second laser pulse, partially overlap the front portion crystal grains 365 of the first sets of crystallized regions 345, generated by a first laser pulse. The crystals of the third set of crystallized regions 340', also generated by the second laser pulse, partially overlap the sides of the first set of crystallized regions 345, filling the space between the individual regions of the first set of crystallized regions 345. As the film is scanned in the x direction, its entire surface can be crystallized.

Because the beamlets are relatively long, much of the crystallized area has crystal grains oriented in the y direction. In contrast, at the front and end regions 360 and 370 respectively, some of the crystals grow from the very ends of the region, so they extend substantially in the x direction (parallel to the scan), and others grow at an angle to the scan direction. These regions are known as "edge areas." Here, artifacts may arise because the edge of the beam, which is reproduced in the molten portion, leads to lateral growth of grains extending in from the edges at angles that are skewed relative to the desired direction of the lateral growth.

According to the above-described method of sequential lateral solidification, an entire region can be crystallized using only two laser pulses. This method is hereinafter referred to as a "two-shot" process, alluding to the fact that only two laser pulses ("shots") are required for complete crystallization. Further detail of the two-shot process is found in U.S. Pat. No. 6,555,449, entitled "Methods for Producing Uniform Large-Grained and Grain Boundary Location Manipulated Polycrystalline Thin Film Semiconductors Using Sequential Lateral Solidification," which is incorporated in its entirety by reference.

The previously described two-shot SLS process can be used to crystallize silicon films for small diameter (e.g., for mobile applications) active-matrix display manufacturing that are made using for example glass panels sized about 730 mm by 920 mm. Processing on larger panels is required for making large diameter active-matrix displays (e.g., for monitor or TV applications), for example up to about 2200 mm by 2500 mm or even larger. An obstacle in developing tools for large-panel manufacturing is the linear stage used to translate the panel: it is not straightforward to have such large stages operate with the precision required in the conventional two-shot SLS process. The following is a description of some of the issues with performing above-described SLS using insufficiently precise stages, in particular describing the effects of stage wobble.

Figure 4A:
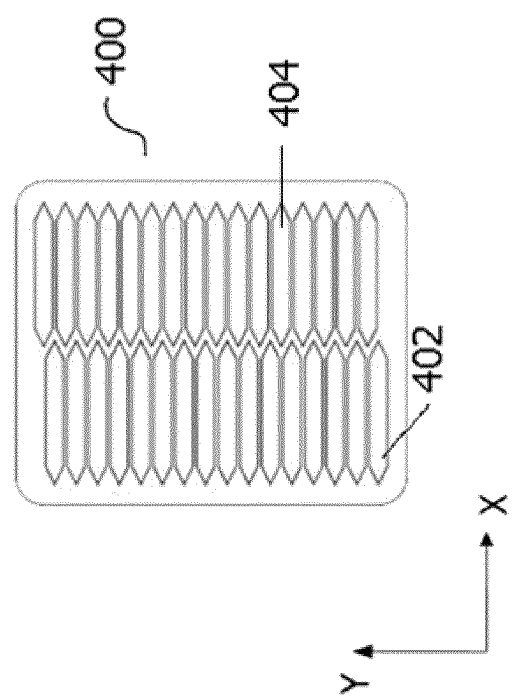
FIG. 4A depicts a mask used in an SLS process.

FIGS. 4A-4E depict the limitations and problems associated with the previously described two-shot SLS processes. FIG. 4A depicts a typical mask pattern used in a two-shot SLS process to create beamlets The mask 400 for the two-shot SLS process includes dual rows of slit arrays, 402, 404, which are aligned at an offset from each other, equivalent to the mask shown in FIG. 3A. Although slits 402, 404 are shown as having triangularly tapered edges, slits with other shapes can also be used. For example, slits with trapezoidal tapers and/or rounded edges may also be used. Rectangular slits, as shown in FIGS. 2A and 3A, also may be used. For further details on selecting beamlet and gap widths, as well as some other example slit shapes or edge shapes, see WO 2005/029546 and U.S. Pat. No. 6,908,835, the entirety of the disclosure of which is explicitly incorporated by reference herein.

FIG. 4B depicts a two shot SLS process on a film 410 on which a plurality of pixels 415, containing thin film transistors (TFTs) or circuits 420 and electrodes 430 is to be developed. As discussed previously, this is a single-scan SLS process where each laser pulse is patterned into arrays of beamlets, the long axes of which are aligned parallel to the scan direction. The beam pulse forms a plurality of crystallized regions, including a first crystallized region 440 and a second crystallized region 450. The depicted crystallized regions 440, 450 are approximately 25 mm long and 1.2 mm wide. The "pixel pitch" (center to center spacing of the pixels) depends on the matrix diameter and the number of nodes in the matrix (where the matrix may correspond to an active matrix backplane for LCD or OLED displays, and the nodes may correspond to individual pixels in such an active matrix backplane) and maybe be as large as 600 µm or more for large matrices, such as large TVs. The depicted second crystallized region 450 overlaps the first region 440 by about 50%. The line 460 depicts the scan direction (which is the direction of the scanning of pulses) and the non-linearity of the line depicts the effects of (y direction) wobble of the stage during the scan, which results in poor overlap of pulses.

FIG. 4C depicts a two-shot SLS scan using previously discussed methods and the mask pattern shown in FIG. 4A. The first laser shot irradiates and melts a portion of the thin film in a pattern corresponding to region 440, which is depicted as 460 in FIG. 4C (dotted lines) (i.e., a first molten zone). The second shot irradiates and melts a portion of the thin film in a pattern corresponding to region 450, which is depicted as 470 in FIG. 4C (solid lines) (i.e., a second molten zone). Each of the molten zones cools and forms crystallized regions 460, 470. As can be seen in FIG. 4C, the crystallized regions 460 and 470 comprise a plurality of areas 461 and 471, etc., respectively, corresponding to each of the beamlets produced by the mask, such that there are unirradiated regions in between the plurality of areas 461, 471. Each molten zone cools and crystallized into areas 461 before the next laser beam strikes the surface of the film and creates molten zones that crystallize into areas 471. FIG. 4C also shows an overlapping portion 480 of the first crystallized region 460 and the second crystallized region 470. For example, overlapping portion 480 includes overlap of areas 461a and 471a. Thus, the area 480 is fully crystallized by the overlapped and distinct radiations corresponding to the right side of areas 461 and the left side of areas 471, with the corresponding elongation of the laterally crystallized grains in region 480 as described above with respect to FIGS. 2-3.

Stage wobble can cause a misalignment of the laser pulses between subsequent laser pulses, as illustrated by the misalignment in region 480 of FIG. 4C. Because of stage wobble, the first column of irradiated regions 461 from the first laser pulse do not precisely align with the first column of irradiated regions 471 from the second laser pulse. This misalignment results in a nonsymmetrical overlap of irradiated regions during the second laser pulse. Therefore, the first column of irradiated regions 471 from the second pulse can be shifted a distance in the direction of arrow 465 (shown in FIG. 4D) from the first column of irradiated regions 461 from the first laser pulse.

The misalignment of the laser pulses results in unevenly spaced long grain boundaries in the final product. The long grain boundary is the center line formed when two laterally growing crystal fronts meet. FIG. 4E is a schematic view of the location of long grain boundaries in the area 480 after two-shot SLS. It depicts the center lines corresponding to long grain boundaries as 490', 491', 492', and 493', in the final product. As can be seen in FIG. 4E, the center lines are not uniformly spaced. FIG. 4E further depicts four crystallographic regions 490, 491, 492, and 493, separated by the long grain boundaries 490', 491', 492', and 493' and including laterally extended grains, depicted as 490A, 490B, 490C etc. for region 490. The center lines, or long grain boundaries 490', 491', 492', and 493', can create barriers to electron flow and reduce electron mobility in the resultant TFT. The reduction of the electron mobility may further depend on the exact location of the long grain boundary within the channel region of the TFT and between the source and the drain regions thereof. A uniform spacing of the long grain boundaries is preferred because it provides more uniform material.

As can be seen in FIG. 4E, the crystallographic regions are not evenly spaced; region 491 is wider than region 490. This non-uniformity in the center lines, which correlates to a non-uniformity in the crystallographic columns formed by stage wobble during the two shot process, not only impacts the uniformity of the material, but it also puts a lower limit on the beamlet width and pitch that can be used. That is, because of the non-uniformity, small beamlet widths and spacings are not feasible. While potentially resulting in lower performance, shorter grains are sometimes desired in order to obtain more uniform thin film transistors ("TFTs") (for example, smaller grains allow more effective averaging effects to take place over those grains that reside in/near the channel region of the TFTs), which is especially critical for active-matrix organic light emitting devices. Further, the occluded grains, resulting from grains in the wider columns not fully extending the width of the wider column, can result in poor device performance.

Another issue with the previously described two-shot SLS process is distortion. Lenses used in projection optics can have aberrations, e.g., astigmatism, that can result in distortion of the beam. Especially away from the center, the distortion in the beam may be noticeable in the crystallized film. FIG. 4F depicts distortion in beamlet formation using the dual array mask depicted in FIG. 4A. As an illustrative example only, the beamlets toward the bottom right corner 1200 of FIG. 4F are increasingly distorted. In two-shot SLS, as shown in FIG. 4G, the first pulse 1210 and second pulse 1220 within the two-shot region overlap by about 50%. The local distortion between those overlapping sections in the two-shot region may be different. For example, if the lower portion of the second (right) array of the beamlets 1200 are skewed because of distortion, the overlap between the second array of beamlets in the first laser pulse 1240 and the first (left) array of beamlets in the second laser pulses 1230 creates a non-uniformity in the spacings of the center lines in the resultant two shot material. As shown in FIG. 4H, the spacings between the center lines of each beamlet are not uniform along the vertical direction of the scan. For example, the spacings between center lines in the upper portion of the scan are relatively equal, while the spacings between the lower portions of the scan are not. The microstructure in the lower portion will thus be like the microstructure in FIG. 4E.

Non-Periodic Pulse SLS

Non-periodic pulse SLS offers a method to make the crystallization process more robust against poor overlapping of beamlets upon subsequent irradiations in arising from, for example, stage wobble, and/or image distortion.

The present system uses non-periodic laser pulses, i.e., pulses that are not equally spaced in the time domain. In one embodiment, the present system creates non-periodic laser pulses by using coordinated triggering of pulses from a plurality of laser sources (as is also possible using a single laser source having multiple laser cavities, e.g., tubes) to produce a series of pulses closely spaced in the time domain. A plurality of laser sources may be provided into a single laser system. A laser system is a computer controlled system that uses computer controlled techniques and one or more laser cavities to produce one or more laser beams. Each laser beam corresponds to one laser source. Each laser beam can be produced from a stand alone laser, or a laser cavity which is part of a plurality of laser cavities contained within one laser system.

An exemplary profile of non-periodic laser pulses is shown in FIG. 5. The y axis represents pulse intensity and the x axis represents time. FIG. 5A depicts a periodic pulse rate of a laser that can be used for a conventional two shot SLS process. The laser repetition rate results in a laser pulse pattern that is evenly spaced in the time domain. FIG. 5B represents an example of non-periodic pulsing disclosed herein where a second pulse 500 is fired in close time relation to the first pulse 510. Then, a third pulse 520 is fired at time interval different than the interval between the first pulse 510 and the second pulse 500. FIG. 5C illustrates an embodiment for which the laser power (energy density) of the two lasers are different. Thus, the irradiated film experiences a non-periodic pulse rate and non-uniform irradiation energy. Because of the relatively short time between the first pulse 510 and the second pulse 500, the regions irradiated by the first pulse 510 and the second pulse 500 experience an increased overlap, as discussed with respect to FIGS. 7A-7B. Additionally, each laser of the plurality of lasers can pulse at a constant repetition rate.

The delay range between the first pulse 510 and the second pulse 500 can be less than half of the time interval between the first pulse 510 and the third pulse 520. In some embodiments, the time interval between first pulse 510 and the second pulse 500 is less than one tenth or less than one twentieth or less than one hundredth the time interval between the first pulse 510 and the third pulse 520. The delay range between the first pulse 510 and the second pulse 510 can be about three microseconds to about one millisecond, about five microseconds to about 500 microseconds, and preferably about 8 microseconds to about 100 microseconds.

For example, the delay can be as small as a few microseconds (e.g., for a stage speed of 40 cm/s and a 3.5 um displacement, the timing would be 8.75 microseconds). If the stage speed is as high as 60 cm/s, then the timing would be 5.83 microseconds. In an n-shot process, i.e., in a process with more than two laser irradiations in a given region (for example, 3, 4, 5, or n radiations in a given region), the overlap may be larger. Such an n-shot SLS process is described in U.S. application Ser. No. 11/372,161, the entire contents of which are hereby incorporated by reference. For example, in an n-shot process, the timing could be 5 microseconds or even 3 microseconds. Because the lateral growth velocity is on the order of up to about 10 microns/second, when melting a 6 microns wide region with an approximately 0.3 microsecond full width half maximum (FWHM) pulse, the film is laterally crystallized in less than about 0.5 us.

In some embodiments, displacement may be more than 3.5 microns. Thus, the delay can be 10 s of microseconds and up to 50 microseconds or even more than 100 microseconds and possibly, as high as a few 100 microseconds. The upper limit can be so high as to approach, but not equal, the repetition rate of two 600 Hz laser combined at 1200 Hz: i.e., 833 microseconds. For example, for 70% overlap the delay would be 500 microseconds. However, if two 300 Hz lasers are used, the delay would be 1 millisecond.

Tools having multiple laser cavities, e.g. tubes, have been disclosed previously to (1) increase the pulse energy by simultaneously triggering and subsequently combining multiple pulses and (2) increase the pulse duration by delayed triggering of various tubes and subsequently combining them, as discussed in U.S. Pat. No. 7,364,952, the entirety of the disclosure of which is explicitly incorporated by reference herein. In other words, pulses are combined to provide a modified single melting and solidification cycle. Non-periodic pulse SLS is different in that it uses the pulses of various lasers in separate melting/solidification cycles. However, the pulses are close enough in the time domain that they show significant overlap while the stage is traveling at high speed.

FIG. 5 presents a non-periodic pulse pattern that employs two closely spaced or a "train" of laser pulses; however, a greater number of closely spaced pulses, e.g., 3-5, corresponding to three to five lasers or laser cavities may be employed. In such embodiments, where a higher number of closely spaced pulses from different lasers, e.g., laser beams from either two different laser energy sources or two different laser carriers of the same laser energy source, are used, the targeted region is irradiated a correspondingly greater number of times and may provide crystallized regions with more elongated crystal domains. For example, n pulses from n laser sources may be closely spaced and a single region will experience n irradiations as described in single-scan. Beamlets may have similar widths as in two shot SLS, but the spacing in between them may be increased to accommodate the greater number of irradiations. Also, the overlap between crystallized regions, each corresponding to individual molten zones, may be larger than 50% (or one times the lateral growth length), resulting in longer grains than the grains that can be obtained in the two shot process (the length of the grains being limited by the number of pulses in a pulse train). The longer grained material may be beneficial for higher performance TFTs.

The two consecutive pulses in a pulse train need not be at the same energy density. For example, if the film is still hot from the first pulse, the second pulse could be at a lower energy density. Likewise, a higher energy density may be used to compensate for the changes in optical properties upon the first pulse (amorphous absorbing slightly better than crystalline). A proper choice for the energy density of the second pulse may thus take in account both effects and possibly others as well. Thus, as shown in FIG. 5C, the first laser pulse and the second laser pulse can have different energy densities.

System for Performing Non-Periodic Pulse SLS

Figure 6:
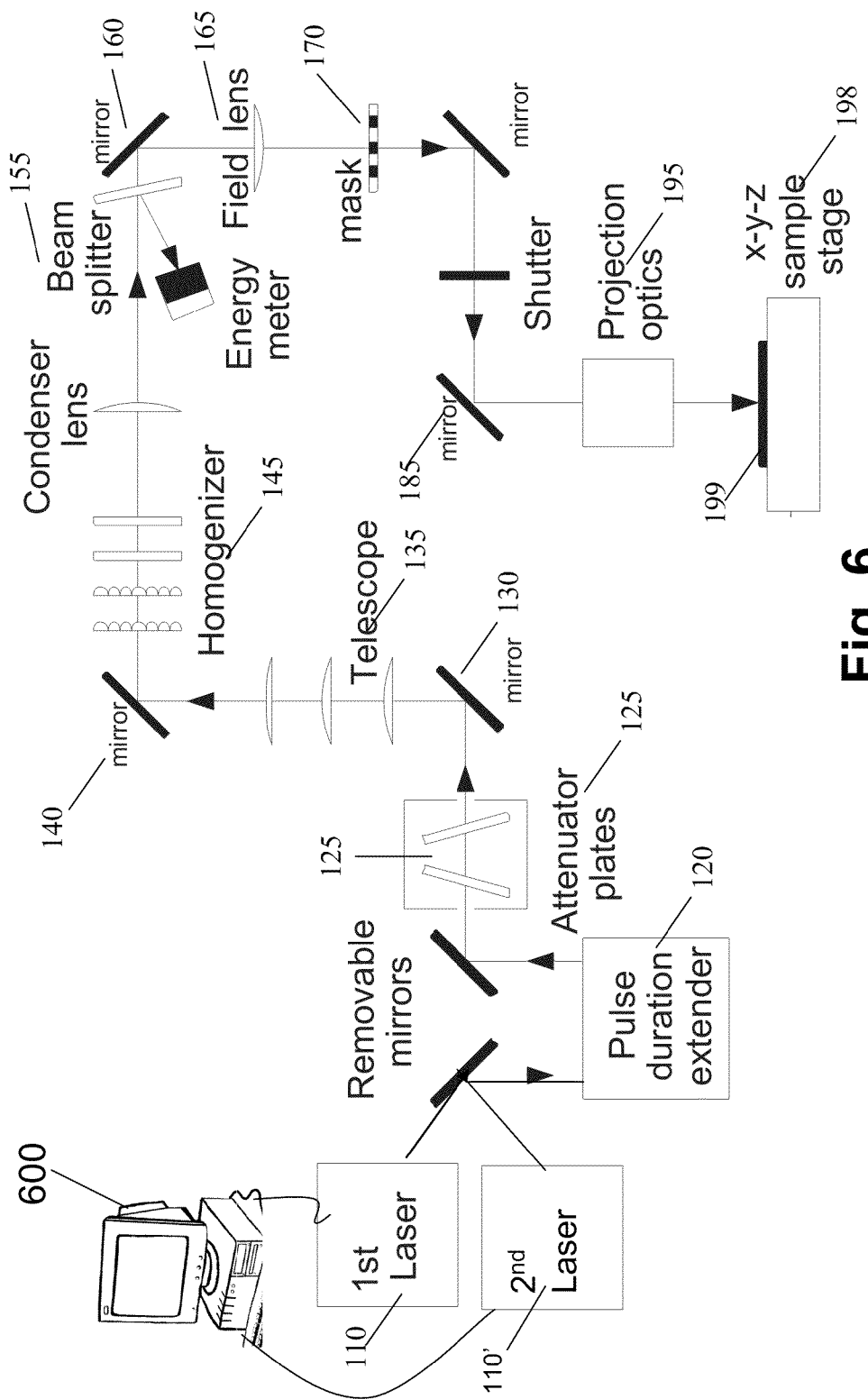
FIG. 6 a system used for a non-periodic pulse SLS process, according to embodiments of the present disclosure.

One method for performing non-periodic pulse SLS implements multiple laser sources, for example a dual laser source. The system for performing SLS using a dual laser source is shown in FIG. 6. FIG. 6 is similar to FIG. 1, except that FIG. 6 has a second laser 110' and a computing arrangement or computer system 600 to control the firing of the two lasers and the movement of the stage. Thus, the computer system 600 provides a computer readable medium and computer readable instructions for stage-position controlled firing of the laser pulses. The system also can include multiple projection lenses to enable simultaneous scanning of multiple sections in a thin film. A system for allowing simultaneous scanning of multiple sections of a thin film is disclosed in U.S. Pat. No. 7,364,952, entitled "System and Method for Processing Thin Films," the entirety of the disclosure of which is explicitly incorporated by reference herein. While the method and system have been described using a dual laser source, additional lasers may be used as well. Other methods for performing non-periodic pulse SLS include operating a high frequency laser in a burst mode and/or in conjunction with a beam stop. Both embodiments will be discussed in more detail below. Additionally, the system may incorporate an interference based set up to perform the same function of creating beamlets as the mask performs.

The non-periodic laser pulse pattern is preferably obtained by the off-set firing of a plurality of lasers of the same repetition rate. Techniques to create non periodic laser pulse patterns using a single laser may exist but are at present considered less effective. In one technique, the triggering mechanism of a laser having a certain repetition rate is modified to create a non periodic pulse sequence having alternate short and long time intervals between consecutive pulses. Lasers such as excimer lasers have a maximum output power that increases with pulse repetition rate until a certain optimum pulse rate after which power starts to drop. In other words, beyond this optimum pulse rate, the maximum energy that a pulse can have will rapidly decrease. Thus, decreasing the time interval between two consecutive pulses for a given laser having a certain maximum pulse energy may result in degradation of the pulse energy, especially for the pulse following the short time interval.

In another technique to create non periodic laser pulse patterns using a single laser, the non-periodic pulse pattern is obtained from a single laser that is operated in a higher power/pulse rate mode, for example, having repetition rates of several kHz up to 10 kHz, adapted to provide downtime between short sequences, e.g., rapid bursts, of uninterrupted laser pulses. Exemplary laser systems suitable for use in the methods and systems described herein include high-frequency lasers, for example, lasers developed by Cymer (San Diego) and used in laser crystallization tools available from TCZ Pte. Ltd. (Singapore), and diode-pumped solid state lasers, for example, available from JENOPTIK Laser, Optik, Systeme GmbH and used in laser crystallization tools available from Innovavent GmbH. However, these high-frequency lasers have correspondingly lower energy per pulse and resultantly pulse dimensions are reduced compared to higher energy per pulse laser such as available from Coherent Inc. (Santa Clara).

The film 199 can be an amorphous or polycrystalline semiconductor film, for example a silicon film. The film can be a continuous film or a discontinuous film. For example, if the film is a discontinuous film, it can be a lithographically patterned film or a selectively deposited film. If the film is a selectively deposited film, it can be via a chemical vapor deposition, sputtered, or a solution processed thin film, for example ink jet printing of silicon based inks Full Area Non-Periodic Pulse SLS FIGS. 7A and 7B depict a non-periodic pulse SLS process using a vertical mask 700 (shown in FIG. 7A). The vertical mask 700 includes an array of vertically positioned, e.g., aligned perpendicular to the scan direction, slits 710, with optional tapered edges. The slits 710 transmit and shape a laser beam to produce a plurality of beamlets of similar shape. The other (non-slit) portions of the mask are opaque. It should be understood that the mask illustration is intended to be schematic only, and that the dimensions and aspect ratios of the slits as well as the number of slits can vary greatly and are related to the desired speed of processing, the energy density needed to melt the film in an irradiated region, and the available energy per pulse. In general, the aspect ratio of width to length for a given slit can vary, e.g., between 1:5 and 1:200 and 1:5000 or more. In other embodiments, the mask can be a dot mask in which the background is transparent and the central "dots" are opaque. Further detail on dot matrix masks is found in U.S. Pat. No. 7,645,337, which is incorporated in its entirety by reference.

As described above with respect to previously discussed two shot SLS, FIG. 7B shows an exemplary illustration of a film that has been irradiated by two sets of two laser pulses, in which the first two laser pulses occur close together in time, followed by a delay, and the second two laser pulses also occur close together in time. The process includes at least four irradiation steps, with two irradiation steps corresponding to pulses from a primary laser and two irradiation steps corresponding to pulses from a secondary laser. The steps are as follows: (1) a first irradiation corresponding to regions 711 that have been irradiated with a first pulse from a primary laser that has been shaped by the mask of FIG. 7A into a first set of beamlets (dotted lines); (2) a second irradiation corresponding to regions 712 that have been irradiated with a first pulse from a secondary laser, that has been shaped by the mask of FIG. 7A into a first set of beamlets (solid line); (3) a third irradiation corresponding to regions 713 that have been irradiated with a second pulse from a primary laser, that has been shaped by the mask of FIG. 7A into a third set of beamlets (dotted line in gray area); and (4) a fourth irradiation corresponding to regions 714 that have been irradiated with a second pulse from a secondary laser, that has been shaped by the mask of FIG. 7A (solid line in gray area), as the film moves in the negative x-direction and the scan thus progresses in the positive x-direction. Where the first and second irradiated regions 711 and 712 overlap, they generate a first two-shot crystallized region 715. Where the third and fourth irradiated regions 713, 714 overlap, they generate a second two-shot crystallized region 716.

When scanning the sample (preferably at a constant stage velocity), the overlap between the first and second crystallized regions 711, 712 and the third and fourth crystallized regions 713, 714 is greater than about 50%. Preferably, the overlap between the first and second crystallized regions 711, 712 and the third and fourth crystallized regions 713, 714 is greater than about 70%, greater than about 90%, greater than about 95% or greater than about 99%. The first irradiation corresponding to region 711 melts the region throughout its thickness; the molten region then quickly laterally crystallizes from the solid edge to form a laterally crystallized region. The second irradiation generated by the first secondary laser pulse spans the unirradiated regions between the individual beamlet regions created by the first set of beamlets and overlap with the first crystallized regions 711. Upon cooling, the crystals in the second region grow from the edge of the second molten region to form crystal grains laterally extended substantially in the x direction (parallel to the direction to the scan). Thus, while the overlap can range from greater than 50% to about 99%, the overlap is selected so that the entire region is crystallized in two laser pulses. The area of the film that is fully crystallized in this manner is referred to as a "two-shot crystallized region." In this example irradiation of the first crystallized region 711, followed by irradiation of second crystallized region 712 results in a first two shot crystallized region 715. Then, irradiation of the third crystallized region 713 and the fourth crystallized region results in a second two shot crystallized region 716. If more than two lasers pulses are used in the pulse train, the overlap can be selected so that the entire region is crystallized by the number of pulses in the pulse train.

The maximum overlap between the first two-shot crystallized region 715 and the second two-shot crystallized region 716 can be such that the first beamlet of the second pulse is positioned exactly between the first and second beamlets of the first pulse. This maximum overlap corresponds to a minimum displacement of half the beamlet pitch for vertically aligned beamlets. If the beamlets are tilted with respect to the vertical alignment (as discussed below), meaning they are not oriented perpendicularly to the scanning direction, the minimum displacement is half the beamlet pitch divided by the cosine of the tilt angle. In an n-shot process (as described above), the first beamlet of the second pulse may be positioned closer to the center line of first beamlet of the first pulse, and the maximum overlap is correspondingly larger. The first and second two shot crystallized regions 715, 716 can be narrower if the overlap between the first pulse and the second pulse is smaller. Where the overlap is smaller, there will be "wings" adjacent to the first and second two shot crystallized regions 715, 716 where those "wings" were irradiated by single non-overlapping beamlets only.

Figure 7C:
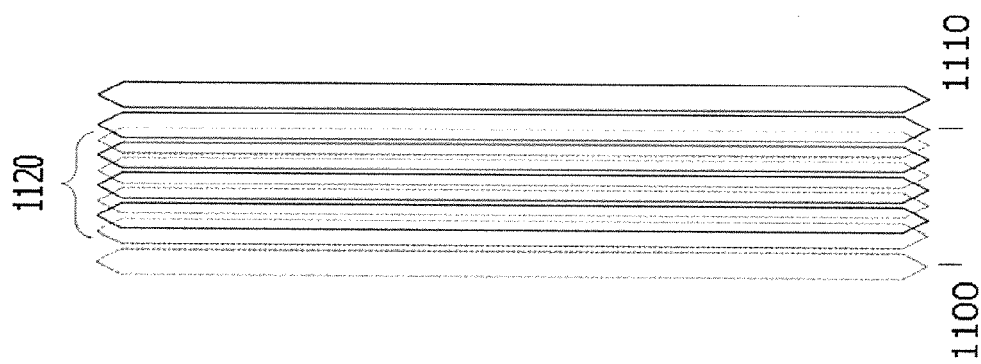
FIG. 7C depicts an alternative overlap scheme in a in a non-periodic pulse SLS process, according to embodiments of the present disclosure.

FIG. 7C depicts an alternative overlap scheme where the second pulse 1110 (solid line) is positioned one and half times the beamlet pitch from the first pulse 1100 (dotted line). The overlap between the first pulse (corresponding to a primary laser) and the second pulse (corresponding to a secondary laser) corresponding to a two shot region can range from about 70% to about 99%. A smaller overlap such as illustrated in FIG. 7C results in smaller two-shot crystallized region 1120. A smaller overlap, and thus a larger delay between pulses, can be beneficial to allow the film to sufficiently cool after the first pulse before irradiating with the second pulse.

The smaller overlap can be used alone or in combination with adjustment of the second pulse energy density as described previously. Additionally, a smaller overlap can be beneficial to mitigate the effects of energy density non uniformity within the beam. As a process that relies on complete melting of the film, SLS is relatively immune to typical variations in the energy density from pulse to pulse or between various sections of the pulse. Energy density variation can result in some mild variation of the width of regions irradiated by a single beamlet. Hence, in a two-shot process, energy density variation can result in some mild variation in the overlap between molten regions and thus the microstructure that results. Thus, it is preferable that a portion of the film is irradiated with a lower energy density in one pulse is not irradiated with a lower energy density in the other pulse as well. For example, if a small section of the beam has a reduced energy density due to imperfections in the optical system, it is preferable to increase the displacement between the two pulses such that one portion in the film is not irradiated twice with this reduced energy density section of the beam.

In operation, a stage moves the film continuously along x direction to effect a pulse scanning direction indicated by arrow 720 in FIG. 7B, so that the long axes of the slits in the mask of FIG. 7A lie substantially perpendicular to the scan direction. As the film moves, the lasers generate pulses at a given frequency, e.g., 300 Hz, which are shaped by the mask. The film velocity and the offset between the firing of laser pulses from both lasers are selected so that as the stage moves, subsequent laser pulses irradiate overlapping regions 711, 712 of the film.

The film velocity and the repetition rate (frequency) of the first and second laser pulse determine the location of subsequent two shot crystallized regions on the film. In one or more embodiments, the first and second two-shot crystallized regions 715 and 716 also can overlap at 745. Therefore, as the film is scanned in the x direction, the entire film surface can be crystallized. If the regions 711 and 712 are displaced only half the pitch of the beamlets (as illustrated in FIG. 7B), then the overlap between regions 715 and 716 can be as small as the overlap between the beamlets, which for two-shot SLS is between zero and one times the lateral growth length. Thus, the overlap between 715 and 716 can be minimized to only beamlet overlap between the right most of the 712 regions and the left most of the 713 regions. The overlap between the first and second two shot crystallized regions can thus range from about 0.5 μm to about 3 μm.

The increased overlap of the first and second 711, 712 and third and fourth regions 713, 714 in FIG. 7B can be accomplished, as discussed above, through the use of two separate lasers. The primary laser fires the pulses resulting in the crystallization of the first and third regions 711, 713, while a secondary laser fires the pulses resulting in the crystallization of the second and fourth pulses resulting in the second and fourth regions 712, 714. The firing of the pulses can be triggered by, for example, a computer controlled system. Because two lasers are used, the first and second regions 711, 712, for example, can overlap to a greater extent than could occur using one laser at current laser frequencies at a given constant stage velocity. It should be emphasized, however, that the present system and method do not rely on the use of multiple laser sources, but rather, requires the generation of a non-periodic laser pulses. As noted above, lasers with sufficiently high laser repetition rates do exist and can be operated in a way to provide downtime between rapid bursts of laser pulses. Developments in laser power and frequency will improve throughput rates and increase the commercial attractiveness of such approaches.

Tilted Scans Using Non-Periodic Pulse SLS

Figure 7E:
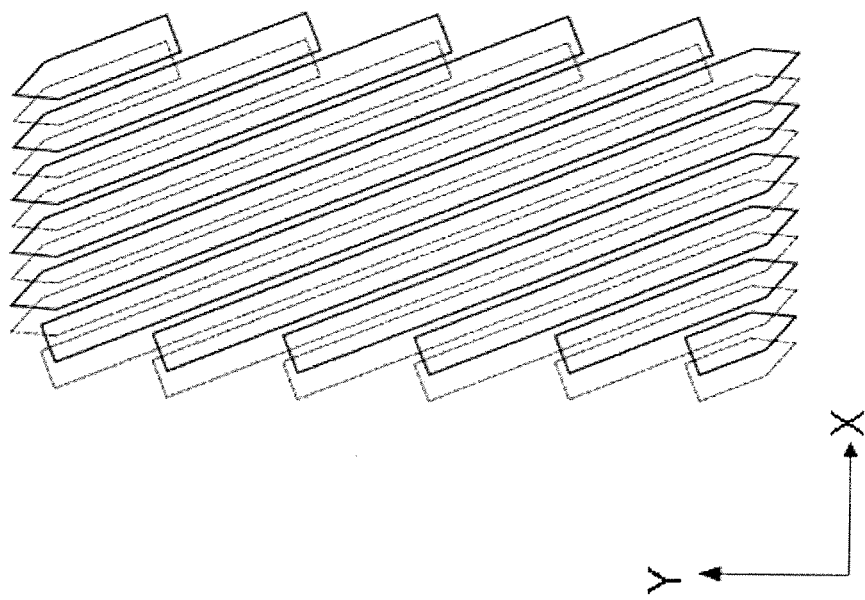
FIGS. 7D and 7E depict a non-periodic pulse SLS process where the beamlets are titled with respect to and edge of the film, according to embodiments of the present disclosure.
Figure 7D:
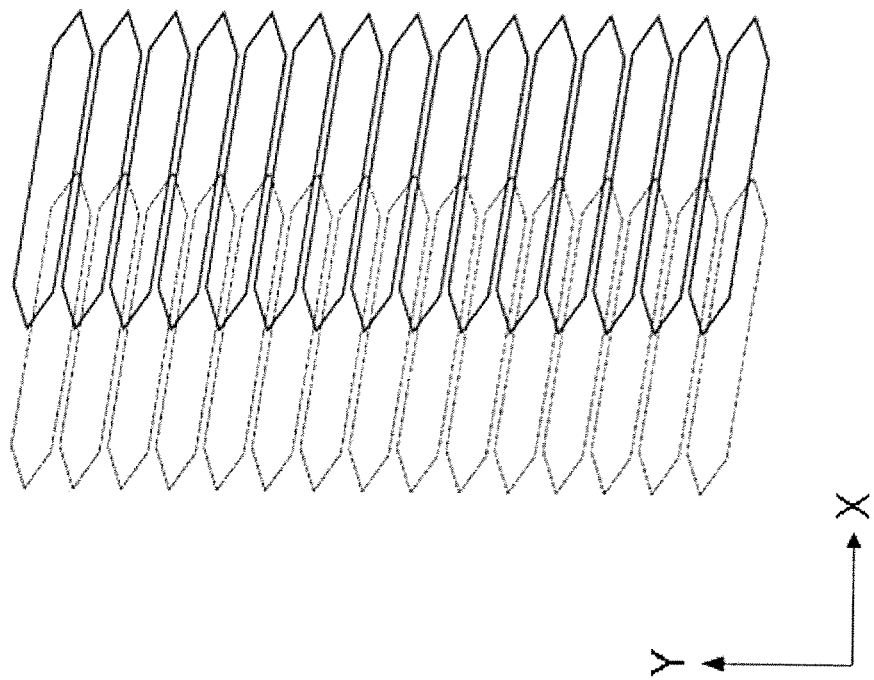

In some embodiments, when an array of TFTs is later fabricated on a film, it may be beneficial if the orientation of the long grain boundaries can be slightly tilted relative to the TFT channel orientation. If the TFTs are aligned parallel to the array orientation and/or the edges of the active-matrix device or the film, diagonal beamlets may for instance be used to do such tilt engineering (see "Polycrystalline TFT Uniformity Through Microstructure Mis-Alignment," U.S. Pat. No. 7,160,763, the entirety of the disclosure of which is explicitly incorporated by reference herein) wherein the beamlets are tilted with respect to the channel regions so as to improve TFT uniformity. FIGS. 7D and 7E depict tilting the beamlets with respect to the y axis of the film. FIG. 7D depicts a smaller tilt angle than FIG. 7E, which as shown in FIG. 7E can result in increased overlap between the first shot and the second shot.

The tilt angle can range from zero degrees to about 90 degrees. Given a certain tilt angle of the beamlets (for example, $\alpha$ with respect to the vertical, y, direction, i.e., the direction perpendicular to the scanning direction), a certain time delay may be calculated between the sequential pulses to provide a translation distance that is equal to $d=0.5\times(\lambda/\cos\alpha)$, wherein $\lambda$ is the beamlet pitch.

For example, for a 75 degree tilt, as shown in FIG. 7D, and 5.5/1.5 μm beamlet width and spacing (i.e., $\lambda=7.0$ μm), the translation distance is about 13.5 μm. At a 10 cm/s scan velocity, this corresponds to a 135 μs delay between consecutive pulses. A tilt of 45 degrees may be used to have the same TFT uniformity for TFTs aligned vertically or horizontally with reference to the edges of the display or panel. A 2+ two shot process also may be performed for example using a tilt of 45 degrees for the first two shots and followed by two shots with a 135 degree tilt, i.e., perpendicular to those of the first two shots. Tilt angles larger than 45 degrees and closer to 90 degrees (e.g., close to vertical) are also possible, e.g., when the display design is rotated 90 degrees with respect to what was assumed before. While the tilt angle affects the overlap between regions processed by consecutive train pulses (larger for smaller angles), the scan-to-scan overlap can in all cases remain as small as on the order of half the beamlet width. Tilted beamlets can be used in both full area and selective area crystallization processes, to be discussed below.

Once the film has been completely scanned in the x direction, the masked beam can be shifted in the y direction to scan the remainder of the film. As shown in FIG. 7B, aside from the region of overlap 745 between each two-shot region 715, 716, it also creates a region of overlap 750 between a first scan 730 and a second scan 740. Thus, beamlet edges may be situated at the overlap regions. Then, like with the overlapped radiations in conventional single-scan two-shot SLS shown in FIG. 4C, there is a need to properly overlap the beam edges to ensure continuation of the microstructure. As discussed previously, this may involve the use of beam edge engineering techniques to ensure that the long axes of grains are oriented substantially perpendicular to the center line of the beamlets. While in a horizontal alignment the end of one beamlet overlaps naturally with its opposite end upon the next pulse in overlap region 745, in the case of tilted beamlets that is not the case. With tilted beamlets, the end of one beamlet has to overlap with the opposite end of another beamlet as dictated by beamlet length and tilt. Thus, the timing of pulses has to be such that the center lines of those beam edges overlap accurately. Beamlet tilt and angle can then be optimized to minimize the overlap between such beam edges.

For non-horizontal beamlet alignments, beam edges also will exist at the top and bottom portions of the patterned beam shown by overlap 750. To ensure continuation of the microstructure from scan to scan, i.e., to ensure perfect stitching of the different regions formed upon scanning, these edge areas also are required to overlap in a proper manner, meaning, in a way that the center lines of beamlets overlap and that the tilt and length of beamlet is chosen such that overlap is minimized. Stage-synchronized control of the laser pulses is required to achieve precise stitching in the overlap area 750.

Variability in the positioning of pulses in the x direction may generally come from inaccuracies in the timing of pulses as well as from variation in the stage velocity, which may for example be sinusoidal. The overlapping between pulses may be affected by this variability in positioning. Inaccuracies in the timing of pulses is usually very small and is mostly the result of jitter, which corresponds to the inaccuracy in the pulse trigger electronics. Jitter may result on the order of a few nanoseconds or more. The shift in positioning of pulses on the film as a result of jitter is extremely small and is to be considered negligible for the present application. For example, a 10 ns delay in pulse, triggering causes a shift at the sample level of only 2 nm for a stage velocity of 20 cm/s. The shift in positioning of pulses on the film as a result of velocity variation may also be very small and is furthermore a gradual shift like in the case of wobble. Therefore, the close positioning in time of two pulses will be beneficial in order to minimize the impact on the microstructure uniformity resulting from such variations.

Beam Distortion

The methods and systems of the present disclosure also can alleviate the effects of beam distortion. In the disclosed non-periodic pulse SLS system and method, because the overlap between the first pulse and the second pulse within a two shot region is greater than about 70%, the overlapping portions of the first pulse and the second pulse in the two shot region are more closely located sections of the beam path such that they will be subject to a more similar degree of distortion. Hence, the final crystallized film should not be noticeably affected by such distortions. FIGS. 7F-H depicts the same distortion in beamlet formation as shown in FIGS. 4F-H. Again, the bottom right portion of the beamlets 1300 in FIG. 7F is distorted. However, FIGS. 7G and 7H depict the non-periodic pulse SLS process such as described for regions 711 and 712 in FIG. 7B. Note, FIG. 4F depicts a vertically aligned mask, while FIG. 7F depicts a horizontally aligned mask. However, in the illustrative examples of FIGS. 4F-4H and FIGS. 7F-7H, an equal degree of distortion is provided in both the x and y directions and it therefore affects vertically aligned beamlets in the same manner as horizontally aligned beamlets. When the center lines of the beamlets in the non-periodic pulse SLS process are measured, it can be seen that the distortion present in FIG. 7F does not affect the regularity of the center lines (FIG. 7H) and therefore does not affect the grain boundaries. This benefit derives from the closer spacing within the beam path between the overlapping portions of the first and second pulse and hence the larger similarity in optical distortion there between.

Thus, the non-periodic SLS system and methods described above are applicable to full area crystallization of thin films. For example, non-periodic SLS can be used for a large area scan of a plurality of relatively closely spaced TFTs on a film.

Selective Area Crystallization Using Non-Periodic Pulse SLS

In some embodiments the non-periodic pulse sequence can further be used to selectively crystallize only certain regions of interest, for example, the pixel TFTs or circuits in an active-matrix device such as a display or a sensor array. In this selective area crystallization (SAC) embodiment, there is no overlap between the first and second two-shot crystallized regions such as there is between regions 715 and 716 shown in FIG. 7B. For example, FIG. 8 depicts a film 820 having closely spaced TFTs 825, scanned using the non-periodic pulse SLS process where there is no overlap between a first two shot region 830 and a second two shot region 840. This process is implemented using the same mask shown in FIG. 7A. Like the embodiment shown in FIG. 7B, the film includes at least four irradiation steps to form two two-shot crystallized regions: a first two shot crystallized region 830 corresponding to a first pulse from each of a primary laser and the secondary laser and a second two shot crystallized region 840 corresponding to a second pulse from each of the primary laser and secondary laser. The irradiation steps for producing the two-shot crystallized regions 830, 840 are as follows: (1) a first irradiation corresponding to region 811 with a first pulse from a primary laser; (2) a second irradiation step corresponding to region 812 with a first pulse from a secondary laser; (3) a third irradiation corresponding to region 813 with a second pulse from a primary laser; and (4) a fourth irradiation step corresponding to regions 814 with a second pulse from a secondary laser, as the film moves in the negative x-direction. In one or more embodiments, the size of the masks/beamlets implemented in SAC is selected such that one or more fully crystallized regions are formed upon two pulses (or n pulses) and each crystallized region is sufficiently large enough to contain at least one node of a matrix-type electronic device or circuit.

In contrast to the embodiment shown in FIG. 7B, only the first and second crystallized regions 811, 812 overlap each other and the third and fourth crystallized regions 813, 814 overlap each other. In this embodiment, there is no overlap between the first two shot region 830 and the second two shot region 840. Hence, the stages on which the sample is held can move at higher velocity to increase the spacing between the first and second two shot regions 830, 840 to match the periodicity of the matrix type electronics. Such increase in stage velocity can result in significant increase in the overall processing throughput. For example, in the pixel array of a display, the density of electronics is rather low, for example, having a pitch of several hundreds of μm or more, e.g., more than 1 mm or more, and significant increase in throughput can be achieved by only crystallizing those regions. Accordingly, the stage can be moved at faster speeds for a given laser pulse rate to accomplish full crystallization of the selected areas on the film. Exemplary values for throughput for an SAC non-periodic pulse SLS system are referenced in the Examples section of this application. Thus, non-periodic pulse SAC's throughput improvement enables more competitive throughputs for large panels, e.g., Gen8 panels (~2.20×2.50 m$^2$), such as required for large television manufacturing.

The single-scan process using non-periodic pulses thus causes a non-periodic placement of pulses on the film with increased overlap between pulses in the regions of interest and decreased overlap outside of those regions. Such non-periodic placement of pulses in a single scan may also be established using periodic laser pulses by way of varying the scan velocity so as to have a low scan velocity during processing of a region of interest and a fast scan velocity between regions of interest. Such rapid acceleration and deceleration may be established for instance using optical means to rapidly redirect the pulses onto the regions of interest. Such optical means could include beam steering elements or rapidly shifting mirrors or an oscillating mask. Such an implementation of a single-scan SAC SLS process may be very demanding on such optical means and may thus be less preferable than the use of a non-periodic pulse system. Also, it does not have the benefits of the non-periodic pulse regarding reducing the errors associated with stage wobble.

Another single-scan SAC process using a periodic laser pulses involves splitting each patterned beam into two or more patterned segments each sufficiently large to crystallize one region of interest and placed a distance apart so that multiple segments simultaneously overlap multiple regions of interest. The scan proceeds at such a velocity that upon a subsequent irradiation the sample has moved a distance equal to an integer number times the pitch so that one segment of the pulse now overlaps with a region previously processed with another segment of the pulse. By proper design of the beam patterns in each segment, the second irradiation can provide lateral extension of crystals grown from the first irradiation. Creating the segments by blocking (masking) parts of the beam will be wasteful as a result of the large spacing between the segments. Rather, beam splitting techniques may be used to redirect portions of the beam either onto the same optical path or onto different optical paths. Such an implementation of a single-scan SAC SLS process does not have the benefits of closely overlapping portions of a patterned beam so as to reduce the effects of beam distortion. Also, it does not have the benefits of the non-periodic pulse regarding reducing the errors associated with stage wobble.

As described above, selective area crystallization involves crystallizing only the regions of interest in for example a matrix-type electronic device or circuit. Thus, the locations of crystallized regions need to be aligned with respect to the locations of the nodes in the matrix-type electronic device or circuit. The step of sample alignment may be achieved according to various techniques. In one technique, sample alignment may readily be established using a crystallization system that further has the ability to position the sample in such a manner that its position can be reproduced in further processing steps for making electronic devices. One common way is for example when the panel is provided with fiducials or alignment marks that are detected prior to crystallization and to which the crystallization process is aligned. Such methods of sample alignment are commonly used in lithographic procedures to make thin-film transistors where submicron accuracy is in overlaying various features of such devices. Sample alignment in SAC needs not be as accurate as in lithography. For example, the crystallized region can be larger than the region of interest by several microns or ten or more micron on each side.

In another technique, sample alignment is established by detecting the location of crystallized regions prior to fabricating the electronic devices. Such may be achieved through detection of the regions themselves wherein electronics are to be placed, or through detection of additional crystallized regions optimized for such alignment purposes, for example, fiducials. The use of a projection crystallization system may have benefits for such sample alignment. The system can be used to create fiducials or alignment marks on a film or substrate for later use in sample alignment. Patterned beamlets can be used to create well defined features that can be used in panel alignment in at least one, the first, of subsequent lithography steps, after which they may be replaced by lithographically defined fiducials. A benefit of complete melting and the associated lateral growth is that perpendicular long grain boundaries have protrusions associated with them that can be made visible using dark view microscopy. In addition, the phase change from amorphous to crystalline may be microscopically visible as a result to a change in optical properties.

A system for sample alignment can include an automated system for detecting fiducials and aligning the sample to a known position with respect to that fiducial. For example, the system can include a computing arrangement for controlling movement and responding to an optical detector that can detect the fiducials on the film. The optical detector can be, for example, a CCD camera.

Figure 9:
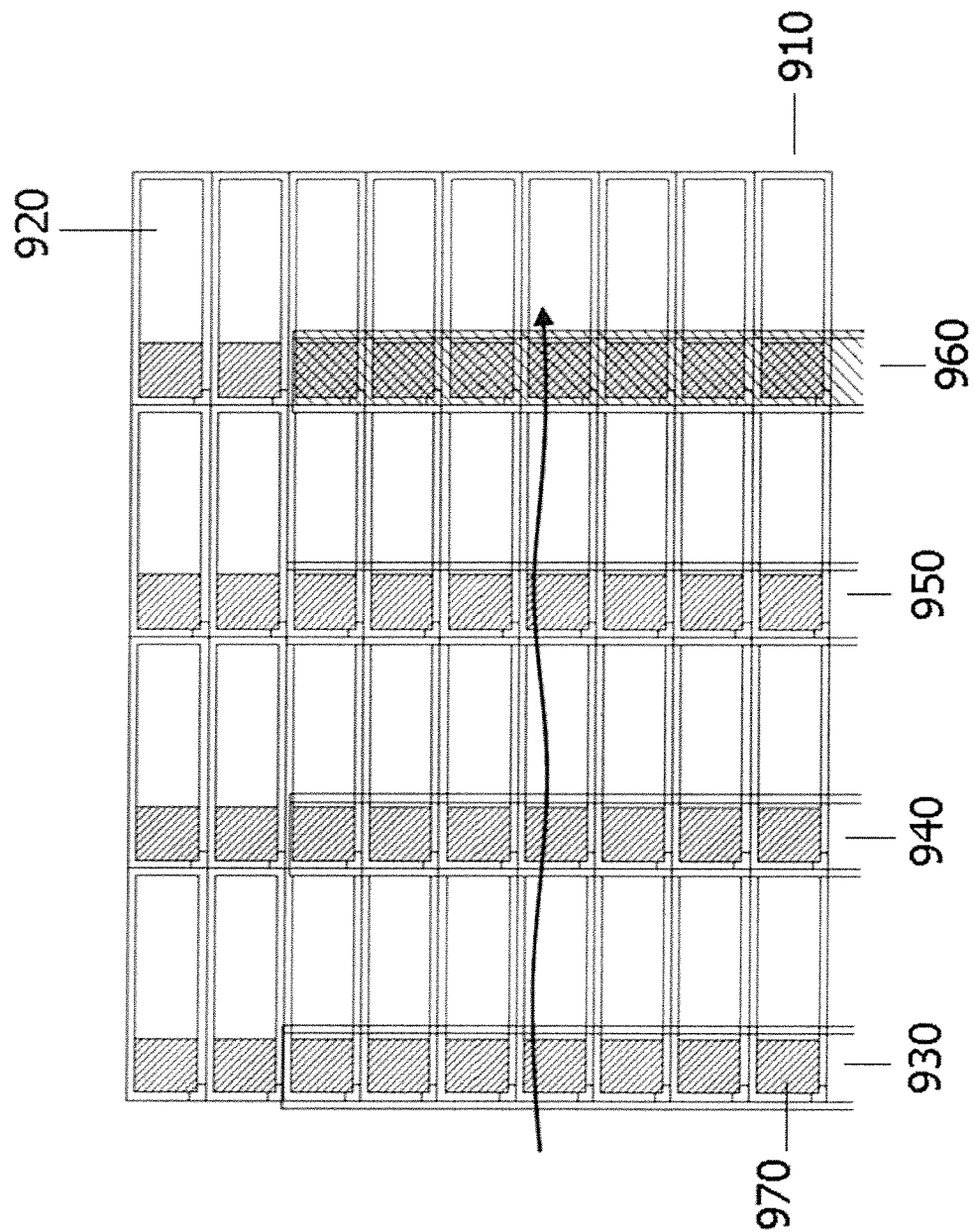
FIG. 9 depicts a film processed by a selective area crystallization non-periodic pulse SLS process, according to embodiments of the present disclosure.

FIG. 9 depicts a film 910 processed by a SAC process. The pixels 920 of the film 910 are positioned horizontally in FIG. 9, while they are positioned vertically in FIGS. 7 and 8. In FIG. 9, the plurality of two shot regions 930, 940, 950, and 960 overlap on the TFTs 970 in the pixels 920.

Compared to previously discussed SLS methods, the beam width in non-periodic pulse SAC SLS may often be less; it need only be as wide as the width of the regions to be crystallized. Hence, surplus energy is available that can be used to increase the beam length. Longer beam length can be realized using larger diameter projection lenses and/or by splitting the beam into separate optical paths so as to simultaneously crystallize multiple regions in the film during scanning of the beam pulses. Increasing the length of the processed region upon a single scan can reduce the number of scans required to fully crystallize the film. The scan velocity may actually be less than for conventional SLS, adding a further benefit of relaxed design metrics for the stages. Relaxed design metrics is a common benefit of non-periodic pulse SLS as a result of the close spacing of the pulses in the time domain and the increased robustness against deviations such as stage wobble and beam distortion.

Maximizing the benefits of SAC using non-periodic pulse SLS requires optimizing the dimensions of the patterned beam as well as optimizing the layout of the pixel TFTs or circuits. Improvements in the pixel TFT and circuit design, for example, can be used for reducing the width of the areas that need to be crystallized. As illustrated in FIG. 9, optimization may involve rotating the subpixel arrangement by 90 degrees and rearranging the layout of pixel TFT and circuits. For example, in a 55 inch display having a 660 μm pixel pitch, the width of the electronics may at most be approximately 300 μm. Therefore, only 300 μm out of 660 μm of the film require crystallization. Additionally, two regions to be crystallized in neighboring columns may be placed close to each other so that a single pair of beams can be used to crystallize that entire area followed by skipping a larger area to the next grouped TFT/circuit areas. For liquid crystal displays having simpler pixel circuits (often just a single TFT), the regions to be crystallized become narrow and the further reduction in beam width and consequential stretching of the beam length over wider-diameter lenses and or a larger number of projection lenses becomes less attractive.

SAC thus entails an increase in crystallization process by selectively crystallizing only certain regions of interest and skipping areas of the film in between. Likewise, the ability to irradiate on selected regions can further be used to avoid the need to do accurate scan-to-scan overlapping of the beamlets as described previously for complete area crystallization, thus eliminating the need for overlapped beam edges that further involve the use of edge engineering. The length of the beamlets can be closely matched to the corresponding dimension of the TFTs or circuits to be crystallized. Thus, the length of beamlets can be chosen such that an integer number of TFTs or circuits fit therein. Between neighboring pixel TFTs or circuits there will be some space left that need not be crystallized. This space is provided for example for the long electrodes connecting the nodes of the active matrix.

Additionally, the beamlets can be subdivided along their length to create sets of beamlets each having a length corresponding to a dimension of the pixel TFTs or circuits. FIG. 10A discloses mask 1010 for use in such a SAC crystallization scheme. No overlap is required at the extreme ends of the beamlets and hence the mask in FIG. 10A has rectangular edges. This masks 1010 can be used with a film 1020, shown in FIG. 10B, having spaced apart pixels 1030, each having a TFT 1040, where the size of the slits in the masks are selected to be slightly larger than the size of the TFTs 1040, such that only those regions are crystallized upon scanning.

By only having slits in the masks where TFTs or circuits will be located on the film, the thermal load on the optics of the system can be reduced, especially with respect to the projection lens. As shown in FIG. 6, the projection optics 195 are downstream from the mask 170. Therefore, if the mask is masking more light, the projection lens will receive less light and will experience reduced overheating.

In SAC, the beam pulses can be made narrow, and the overlap between the first and the second pulses can in some embodiments be less than 50%, while the time to the next pulse is still considerably longer. The time between the pulses may thus still be very short and the benefits of non periodic scan SLS are maintained. In some SAC embodiments where the overlap between the first and second pulses is limited, while the two-shot crystallized regions do not overlap, the wings on either side of these regions may overlap with the wings of neighboring two-shot crystallized regions.

EXAMPLES

As discussed above, non-periodic pulse SLS using selective area crystallization can have a high throughput. Assuming a 1.2 kW laser having two tubes each radiating at 600 Hz (1 J/pulse) and creating a two times 5 cm×0.3 mm pulse dimension using two 50 mm field of view projection lenses, a display having a 660 micron pixel spacing made from a Gen8 panel can then be processed in 22 scans with each a 1 sec turn around time for a total of 22×250 cm/(600 Hz×660 μm)+21 or approximately 160 sec. The resultant scan velocity is then close to 40 cm/s. With a 30 sec loading and unloading time, this can result in a processing throughput of 30 days×24 hours×3 600 seconds×(1/(160+30) sec) or approximately 13.6 k panels/month. Further assuming an 85% uptime for the equipment, this can result in a throughput of 11.6 k panels/month.

Performing conventional SLS using a 1.2 kW laser produced from two tubes out of phase (i.e., combined into a periodic 1200 Hz pulse sequence) and a 5 cm×0.6 mm pulse dimension (a single 50 mm field of view projection lens) the stage velocity appropriate for achieving 50% overlap between pulses is 36 cm/s and the number of scans doubles (i.e. 44). Hence, processing time per panel using conventional SLS is more than double the processing time than that for the above example of SAC non-periodic pulse SLS.

While there have been shown and described examples of the present invention, it will be readily apparent to those skilled in the art that various changes and modifications may be made therein without departing from the scope of the invention. By way of example, it is appreciated that advancing a thin film in a selected direction can be accomplished by holding the laser beam stationary and moving the film relative to the laser source as well as the embodiment wherein the film is stationary and the beam is moving.

The invention claimed is:

1. A method of processing a thin film comprising:
while advancing a thin film in a selected direction,
irradiating a first region of the thin film with a first laser pulse and a second laser pulse, each laser pulse providing a shaped beam and having a fluence that is sufficient to melt the thin film throughout its thickness to form a first molten zone and a second molten zone, respectively, that laterally crystallize upon cooling, wherein the second molten zone crystallizes upon cooling to form one or more laterally grown crystals that are elongations of the one or more laterally grown crystals formed from the first molten zone; and irradiating a second region of the thin film with a third laser pulse and a fourth laser pulse, each pulse providing a shaped beam and having a fluence that is sufficient to melt the thin film throughout its thickness to form a third molten zone and a fourth molten zone, respectively, that laterally crystallize upon cooling, wherein the fourth molten zone crystallizes upon cooling to form one or more laterally grown crystals that are elongations of the one or more laterally grown crystals formed from the third molten zone;

wherein the time interval between the first laser pulse and the second laser pulse is less than half the time interval between the first laser pulse and the third laser pulse.

2. The method of claim 1, wherein a first laser source generates the first laser pulse and the third laser pulse and a second laser source generates the second laser pulse and the fourth laser pulse.

3. The method of claim 2, wherein the first and second laser sources pulse at a constant repetition rate.

4. The method of claim 1, wherein the thin film is continuously advanced in the selected direction.

5. The method of claim 1, wherein the beams provided from each of the first and second laser pulses overlap in the first region of the thin film, and the beams provided from each of the third and fourth laser pulses overlap in the second region of the thin film and wherein the overlap between the laser pulses in each of the first region and the second region of the thin film comprises greater than 90% overlap.

6. The method of claim 5, wherein overlap comprises greater than 95% overlap.

7. The method of claim 5, wherein overlap comprises greater than 99% overlap.

8. The method of claim 1, wherein the shaped beam is obtained by directing the laser pulse through a mask.

9. The method of claim 1, wherein the shaped beam comprises a plurality of beamlets.

10. The method of claim 9, wherein the plurality of beamlets are positioned at an angle relative to an edge of the film.

11. The method of claim 9, wherein the beamlets comprise edge engineered beamlets.

12. The method of claim 1, wherein the shaped beam comprises a dot pattern.

13. The method of claim 1, wherein the second region overlaps the first region.

14. The method of claim 1, wherein the first and second regions are spaced apart from one another and separated by an unirradiated area of the film.

15. The method of claim 1, wherein an edge of the film is positioned at an angle relative to the selected direction.

16. The method of claim 1 comprising fabricating an electronic device in each of the first region and the second region of the thin film.

17. The method of claim 1, wherein the size of the first and second regions is selected to form a crystallized region sufficiently large enough to contain one circuit belonging to a node of a matrix-type electronic device.

18. The method of claim 2, wherein the first laser source and the second laser source are two different lasers.

19. The method of claim 2, wherein the first laser source and the second laser source are two separate laser cavities within one laser system.

20. The method of claim 1, comprising a fourth pulse between the second pulse and the third pulse such that the time interval between the fourth pulse and the second pulse is shorter than the time interval between the fourth pulse and the third pulse.

21. A thin film processed according to the method of claim 1.

22. An electronic device comprising a thin film processed according to the method of claim 1.

23. The electronic device of claim 22 comprising a thin film transistor in each of the first region and the second region of the thin film.

24. A method of processing a thin film comprising:
while advancing a thin film in a selected direction,
irradiating a plurality of first regions across the thin film by a plurality of first beams provided by a plurality of first laser pulses;
irradiating a plurality of second regions across the thin film by a plurality of second beams provided by a plurality of second laser pulses; and
wherein each beam of the first and second beams has a fluence that is sufficient to melt a film throughout its thickness in an irradiated region and the molten irradiated region subsequently laterally crystallizes upon cooling to form one or more laterally grown crystals, and
wherein the overlap in irradiation between each set of the first and second regions is larger than the overlap in irradiation between a first set of first and second regions and a subsequent set of first and second regions.

25. The method of claim 24, wherein the a first set of second molten irradiated region crystallizes upon cooling to form one or more laterally grown crystals that are elongations of the one or more laterally grown crystals formed from the first set of first molten irradiated regions.

26. The method of claim 24, wherein a primary laser source generates the plurality of first laser pulses and a secondary laser source generates the plurality of second laser pulses.

27. The method of claim 24, wherein the overlap between the first and second regions in a set of first and second regions is greater than 90%.

28. The method of claim 24, wherein the overlap between the first and second regions in a set of first and second regions is greater than 95%.

29. The method of claim 24, wherein the overlap between the first and second regions in a set of first and second regions is greater than 99%.

30. The method of claim 24, wherein the overlap between the first set of second regions and the nearest second set of first regions is less than 10%.

31. The method of claim 24, wherein the overlap between the first set of second regions and the nearest second set of first regions is less than 1%.

32. The method of claim 24, wherein the overlap between the first set of second regions and the second set of first regions is zero.

33. The method of claim 24, wherein the first set of second regions and the second set of first regions are spaced apart from one another and separated by an unirradiated area of the film.

34. The method of claim 24, wherein the primary and secondary lasers sources pulse at a constant repetition rate.

35. The method of claim 24, wherein the film is continuously advanced in a selected direction.

36. The method of claim 35, wherein an edge of the film is positioned at an angle relative to the selected direction.

37. The method of claim 24, wherein the beam comprises a plurality of beamlets.

38. The method of claim 37, wherein the plurality of beamlets are positioned at an angle relative to an edge of the film.

39. The method of claim 24, wherein the sizes of the first and second regions are selected to form a crystallized region sufficiently large enough to contain one circuit belonging to a node of a matrix-type electronic device.

* * * * *